(12) United States Patent
Kim et al.

(10) Patent No.: US 11,825,226 B2
(45) Date of Patent: Nov. 21, 2023

(54) IMAGE SENSOR AND PIXEL ARRAY OF IMAGE SENSOR

(71) Applicant: SAMSUNG ELECTRONICS CO., LTD., Suwon-si (KR)

(72) Inventors: Mooyoung Kim, Suwon-si (KR); Jaejin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 44 days.

(21) Appl. No.: 17/539,586

(22) Filed: Dec. 1, 2021

(65) Prior Publication Data
US 2022/0174232 A1 Jun. 2, 2022

(30) Foreign Application Priority Data
Dec. 2, 2020 (KR) .................. 10-2020-0166961

(51) Int. Cl.
*H04N 25/75* (2023.01)
*H01L 27/146* (2006.01)
*H04N 25/772* (2023.01)

(52) U.S. Cl.
CPC ....... *H04N 25/75* (2023.01); *H01L 27/14621* (2013.01); *H01L 27/14627* (2013.01); *H01L 27/14641* (2013.01); *H04N 25/772* (2023.01)

(58) Field of Classification Search
CPC .... H04N 25/75; H04N 25/772; H04N 25/134; H04N 25/46; H04N 25/778; H04N 25/766; H01L 27/14621; H01L 27/14627; H01L 27/14641
See application file for complete search history.

(56) References Cited

U.S. PATENT DOCUMENTS

| | | |
|---|---|---|
| 7,929,807 B2 | 4/2011 | Andersen |
| 10,200,645 B2 | 2/2019 | Koh et al. |
| 10,277,843 B2 | 4/2019 | Smith et al. |
| 10,397,553 B2 | 8/2019 | Wang et al. |
| 10,484,627 B2 | 11/2019 | Zhou |
| 10,567,683 B2 | 2/2020 | Guidash et al. |
| 10,594,959 B2 | 3/2020 | Kaehler |

(Continued)

FOREIGN PATENT DOCUMENTS

| | | |
|---|---|---|
| JP | 2019161577 | 9/2019 |
| KR | 1020160070975 | 6/2016 |

*Primary Examiner* — Lin Ye
*Assistant Examiner* — John H Morehead, III
(74) *Attorney, Agent, or Firm* — F. Chau & Associates, LLC

(57) ABSTRACT

An image sensor includes a pixel array including a plurality of shared pixels including a plurality of photoelectric conversion elements arranged in a first direction and a second direction and connected to a same floating diffusion node, and a plurality of column lines connected to the plurality of shared pixels, extending in the second direction, and arranged in parallel. The image sensor further includes an analog-to-digital conversion circuit including a plurality of analog-to-digital converters (ADCs) connected to the plurality of column lines. At least two first shared pixels consecutively arranged in parallel in at least one of the first and second directions and configured to sense an optical signal of a first color among the plurality of shared pixels are connected to different column lines among the plurality of column lines.

20 Claims, 30 Drawing Sheets

(56) References Cited

U.S. PATENT DOCUMENTS

| | | | |
|---|---|---|---|
| 10,594,973 B2 | 3/2020 | Vogelsang et al. | |
| 2010/0097508 A1* | 4/2010 | Yanagita | H04N 25/709 |
| | | | 348/301 |
| 2012/0113290 A1* | 5/2012 | Nakata | H04N 25/75 |
| | | | 348/E5.037 |
| 2013/0321685 A1* | 12/2013 | Ahn | H04N 25/76 |
| | | | 348/308 |
| 2015/0163464 A1* | 6/2015 | Egawa | H01L 27/14603 |
| | | | 348/274 |
| 2016/0056198 A1* | 2/2016 | Lee | H01L 27/1463 |
| | | | 257/225 |
| 2016/0064446 A1* | 3/2016 | Lee | H01L 27/14603 |
| | | | 257/368 |
| 2016/0165163 A1* | 6/2016 | Suzuki | H04N 25/65 |
| | | | 348/322 |
| 2017/0019584 A1* | 1/2017 | Ham | H04N 25/76 |
| 2017/0195589 A1* | 7/2017 | Kovacovsky | G06T 7/80 |
| 2017/0244844 A1* | 8/2017 | Miyoshi | H04N 1/00013 |
| 2018/0204867 A1* | 7/2018 | Kim | H01L 24/80 |
| 2019/0166317 A1* | 5/2019 | Tanaka | H04N 25/131 |
| 2019/0259795 A1 | 8/2019 | Jang et al. | |
| 2020/0099873 A1 | 3/2020 | Hwang et al. | |
| 2020/0106980 A1 | 4/2020 | Millet | |
| 2020/0120293 A1* | 4/2020 | Gruev | A61B 1/000094 |
| 2020/0389608 A1* | 12/2020 | Baek | H01L 28/60 |
| 2020/0389617 A1* | 12/2020 | Totsuka | H01L 27/14612 |

* cited by examiner

IMAGE SENSOR AND PIXEL ARRAY OF IMAGE SENSOR

CROSS-REFERENCE TO RELATED APPLICATIONS

This application is based on and claims priority under 35 U.S.C. § 119 to Korean Patent Application No. 10-2020-0166961, filed on Dec. 2, 2020 in the Korean Intellectual Property Office, the disclosure of which is incorporated by reference herein in its entirety.

TECHNICAL FIELD

Embodiments of the inventive concept relate to an image sensor, and more particularly, to an output line connection method and a reading method of a pixel array of an image sensor.

DISCUSSION OF RELATED ART

An image sensor is a device that captures a two-dimensional or three-dimensional image of an object. The image sensor generates an image of an object by using a photosensing element that reacts according to the intensity of light reflected from the object. Recently, a Complementary Metal-Oxide Semiconductor (CMOS)-based image sensor capable of achieving high-resolution images has been widely used. As the degree of integration of pixels is increased for high resolution implementation, an area of a photoelectric conversion element per pixel decreases, and thus, sensitivity and the amount of saturation signal charge may decrease.

SUMMARY

Embodiments of the inventive concept are directed to providing an output line connection method and a reading method for increasing the readout efficiency of a pixel array having a structure in which a floating diffusion node is shared by a plurality of photoelectric conversion elements.

According to an embodiment of the inventive concept, an image sensor includes a pixel array including a plurality of shared pixels including a plurality of subpixels arranged in a first direction and a second direction and connected to the same floating diffusion node, and a plurality of column lines connected to the plurality of shared pixels, extending in the second direction, and arranged in parallel in the first direction. The image sensor further includes an analog-to-digital conversion circuit including a plurality of analog-to-digital converters (ADCs) connected to the plurality of column lines. Each of the plurality of ADCs converts a sensing signal received from a corresponding column line among the plurality of column lines into a pixel value. At least two first shared pixels consecutively arranged in parallel in at least one of the first and second directions and configured to sense an optical signal of a first color among the plurality of shared pixels are connected to a first column line among the plurality of column lines.

According to an embodiment of the inventive concept, an image sensor includes a pixel array including a plurality of shared pixels including a plurality of photoelectric conversion elements arranged in a first direction and a second direction and connected to the same floating diffusion node, and a plurality of column lines connected to the plurality of shared pixels, extending in the second direction, and arranged in parallel in the first direction. The image sensor further includes an analog-to-digital conversion circuit including a plurality of analog-to-digital converters (ADCs) connected to the plurality of column lines. Each of the plurality of ADCs converts a sensing signal received from a corresponding column line among the plurality of column lines into a pixel value. At least two first shared pixels consecutively arranged in parallel in at least one of the first and second directions and configured to sense an optical signal of a first color among the plurality of shared pixels are connected to different column lines among the plurality of column lines.

According to an embodiment of the inventive concept, a pixel array of an image sensor includes a plurality of subpixels arranged in a matrix in a first direction and a second direction, and a plurality of output lines extending in the second direction. Each of the plurality of output lines is arranged between two subpixels adjacent to each other in the first direction among the plurality of subpixels. A first pixel including nine subpixels configured to sense an optical signal of the first color and arranged in a matrix among the plurality of subpixels is connected to a first output line among a plurality of output lines.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
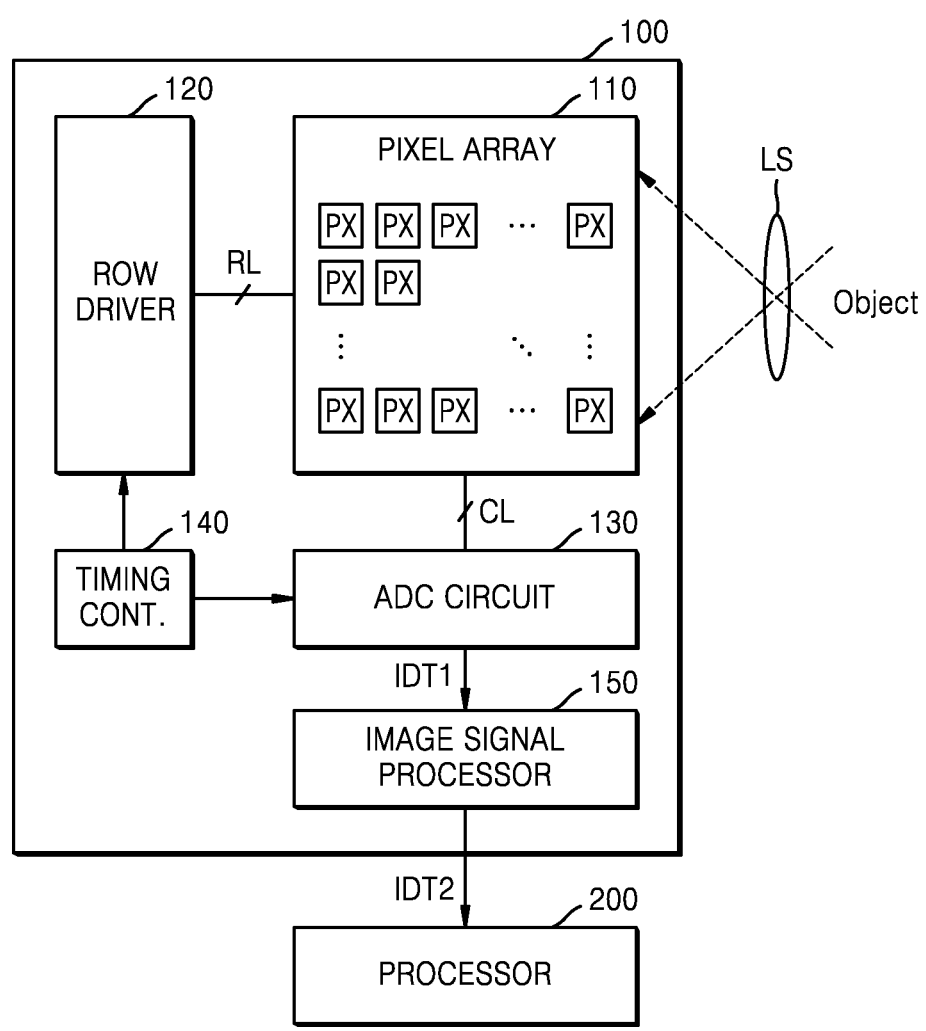
FIG. 1 is a schematic block diagram of an image sensor according to an embodiment of the inventive concept.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

As used herein, the term "and/or" includes any and all combinations of one or more of the associated listed items.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc.

Figure 2A:
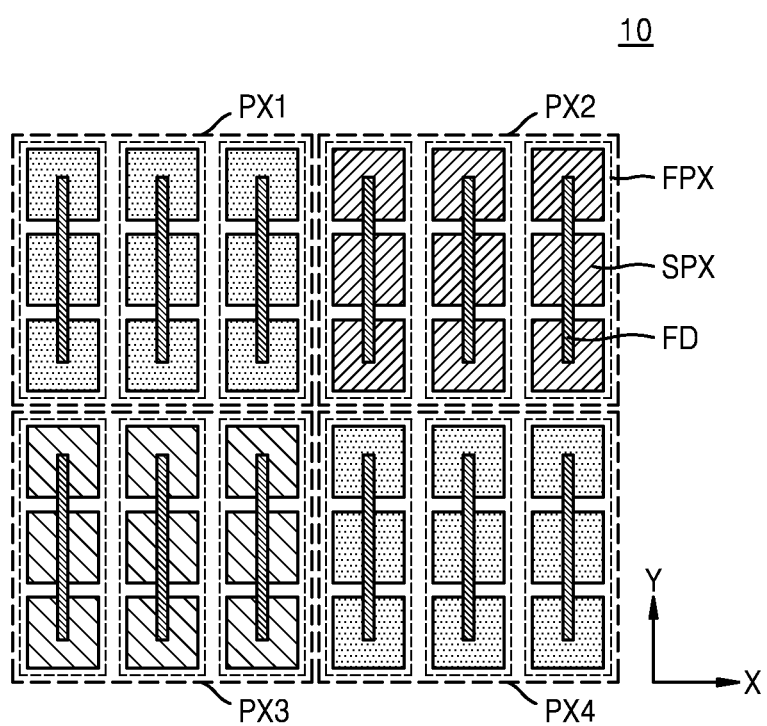
FIGS. 2A and 2B are diagrams schematically illustrating examples of a pixel array of an image sensor according to embodiments of the inventive concept.
Figure 2B:
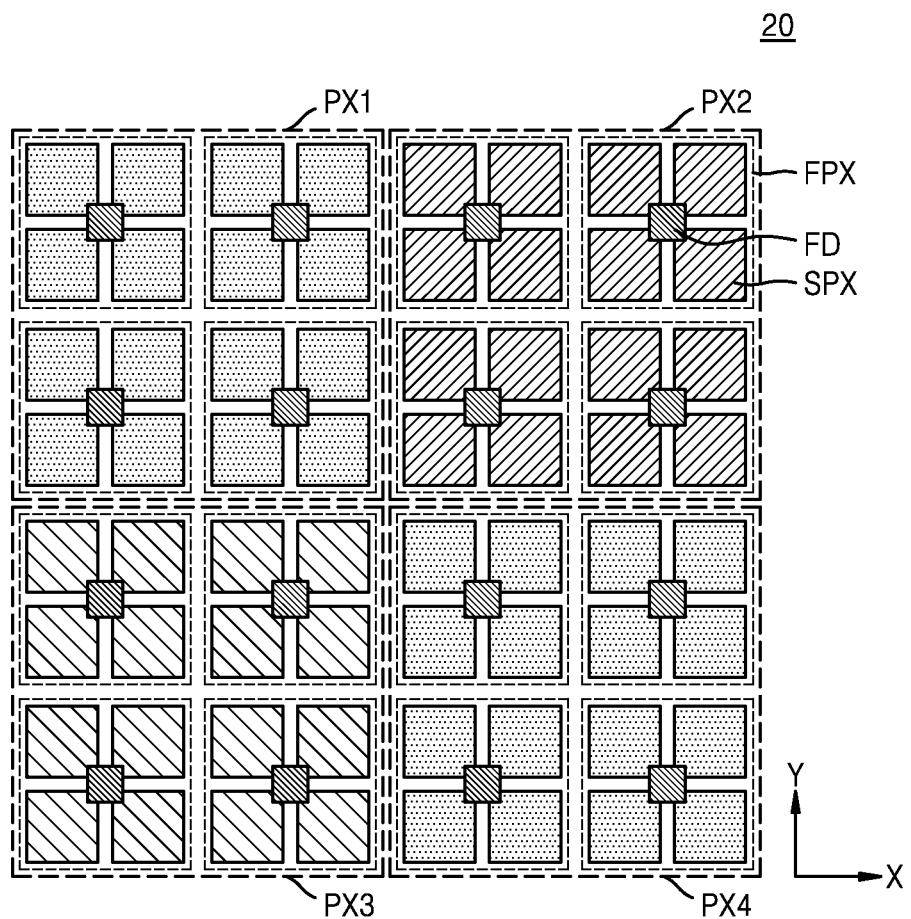

FIG. 1 is a block diagram schematically illustrating an image sensor 100 according to an embodiment of the inventive concept. FIGS. 2A and 2B are diagram schematically illustrating examples of a pixel array 110 of the image sensor 100 according to an embodiment of the inventive concept.

According to an embodiment of the inventive concept, the image sensor 100 may be mounted in an electronic device having an image or light sensing function. According to an embodiment of the inventive concept, the image sensor 100 may be mounted in an electronic device having an autofocusing function. For example, the image sensor 100 may be mounted in an electronic device such as a camera, a smartphone, a wearable device, an Internet of Things (IoT) device, a tablet personal computer (PC), a personal digital assistant (PDA), a portable multimedia player (PMP), a navigation device, etc. The image sensor 100 may be also mounted in an electronic device provided as a component of, for example, a vehicle, furniture, manufacturing facilities, doors, various measuring devices, etc.

The image sensor 100 may include the pixel array 110, a row driver 120, an analog-to-digital conversion circuit (hereinafter referred to as an ADC circuit) 130, a timing controller 140, and an image signal processor 150.

The pixel array 110 may receive an optical signal incident through a lens LS and reflected from an object, and convert the optical signal into an electrical signal. In an embodiment, the pixel array 110 may be embodied as a Complementary Metal Oxide Semiconductor (CMOS).

The pixel array 110 may include a plurality of row lines RL, a plurality of column lines (or output lines) CL, and a plurality of pixels PX connected to the plurality of row lines RL and the plurality of column lines CL and arranged in a matrix.

Each of the plurality of pixels PX may sense a received optical signal by using a photoelectric conversion element. The plurality of pixels PX may detect the amount of light of the optical signal and output a sensing signal, which is an electrical signal representing the detected amount of light. The plurality of pixels PX may include, for example, a red pixel, a green pixel, and a blue pixel. The red pixel may generate a sensing signal corresponding to a red color light signal in response to wavelengths in a red range of a visible light region. The green pixel may generate a sensing signal corresponding to a green color light signal in response to wavelengths in a green range of the visible light region. The blue pixel may generate a sensing signal corresponding to a blue color light signal in response to wavelengths in a blue range of the visible light region. However, embodiments of the inventive concept are not limited thereto. For example, according to embodiments of the inventive concept, the plurality of pixels PX may further include a cyan pixel, a yellow pixel, a magenta pixel, and/or a white pixel.

A pixel array 10 illustrated in FIG. 2A and a pixel array 20 illustrated in FIG. 2B may be applied to the pixel array 110 of FIG. 1. As illustrated in FIGS. 2A and 2B, the plurality of pixels PX, e.g., first to fourth pixels PX1 to PX4, may be arranged in a matrix, and each of the plurality of pixels PX may include a plurality of subpixels SPX arranged in a matrix. In an embodiment, a plurality of row lines RL may extend in a first direction (e.g., an X-axis direction) within the pixel array 110 and may be arranged in parallel in a second direction (e.g., a Y-axis direction). A plurality of column lines CL may extend in the second direction and be arranged in parallel in the first direction.

Two pixels PX arranged consecutively in parallel in the first direction (e.g., the X-axis direction) and the second direction (e.g., the Y-axis direction) may sense optical signals of different colors. For example, the first pixel PX1 and the second pixel PX2 may sense optical signals of different colors, and the first pixel PX1 and the third pixel PX3 may sense optical signals of different colors. A plurality of subpixels SPX included in one pixel PX may include color filters of the same color and sense optical signals of the same color. In an embodiment, the first pixel PX1 and the fourth pixel PX4 arranged in a diagonal direction may sense a green color light signal, and the second pixel PX2 and the third pixel PX3 arranged in another diagonal direction may respectively sense a red color optical signal and a blue color optical signal. The first pixel PX1, the second pixel PX2, the third pixel PX3, and the fourth pixel PX4 may be referred to as a first green pixel, a red pixel, a blue pixel, and a second green pixel, respectively.

In the pixel array 110, pixel groups each including a combination of the first to fourth pixels PX1 to PX4, e.g., the first to fourth pixels PX1 to PX4 arranged in a 2×2 matrix, may be arranged in the first direction and the second direction.

A plurality of subpixels SPX included in one pixel PX may be classified as a plurality of shared pixels FPX. Each of the plurality of shared pixels FPX may include a floating diffusion node FD, read elements for outputting a sensing signal corresponding to photocharges accumulated in the floating diffusion node FD, and a plurality of subpixels SPX continuously arranged in at least one of the first direction (e.g., the X-axis direction) and the second directions (e.g., the Y-axis direction) and sharing the floating diffusion node FD. The plurality of shared pixels FPX may be referred to as a subpixel group.

For example, in the pixel array 10 of FIG. 2A, one pixel PX may include three shared pixels FPX consecutively arranged in the X-axis direction, and each of the three shared pixels FPX may include three subpixels SPX consecutively arranged in the Y-axis direction and sharing the floating diffusion node FD. As another example, one pixel PX in the pixel array 20 of FIG. 2B may include four shared pixels FPX consecutively arranged in the X-axis direction and the Y-axis direction, and each of the four shared pixels FPX may include four subpixels SPX consecutively arranged in the X-axis direction and the Y-axis direction and sharing the floating diffusion node FD. However, embodiments of the inventive concept are not limited to the structure of the pixel array 10 of FIG. 2A and the structure of the pixel array 20 of FIG. 2B. For example, according to embodiments of the inventive concept, the number and arrangement direction of shared pixels FPX included in each pixel PX and the number and arrangement direction of subpixels SPX included in each shared pixel FPX may vary.

Each subpixel SPX may include a photoelectric conversion element, a color filter, and a microlens, and may sense an optical signal received through the microlens by using the photoelectric conversion element. In embodiments of the inventive concept, the subpixel SPX may be referred to as a sensing pixel. Examples of the photoelectric conversion element may include a photodiode, a phototransistor, a photogate, a pinned photodiode, an organic photodiode, an organic photo film, etc. Hereinafter, a photodiode will be described as an example of a photoelectric conversion element. However, embodiments of the inventive concept are not limited thereto.

Each shared pixel FPX may include a plurality of subpixels SPX and a floating diffusion node FD, and further include a plurality of read elements. The plurality of read elements may operate based on control signals received through row lines RL.

In an embodiment, a plurality of shared pixels FPX included in one pixel PX may be connected to one column line CL. In an embodiment, at least two of the plurality of shared pixels FPX may be connected to one column line CL. In an embodiment, at least two of the plurality of shared pixels FPX may be connected to different column lines CL. A connection structure of the plurality of shared pixels FPX and the plurality of column lines CL may affect the readout efficiency of the pixel array 110 and a frame rate of the image sensor 100. A connection relationship between the plurality of shared pixels FPX and the plurality of column lines CL of the pixel array 110, and an arrangement of the plurality of column lines CL according to an embodiment of the inventive concept, will be described in detail below with reference to FIGS. 3A to 16.

Referring back to FIG. 1, the row driver 120 may generate a plurality of control signals for controlling operations of the pixels PX arranged in each row under control of the timing controller 140. The row driver 120 may provide the plurality of control signals to the plurality of pixels PX of the pixel array 110 through the plurality of row lines RL. The pixel array 110 may be driven in units of rows in response to the plurality of control signals provided from the row driver 120. In an embodiment, the same control signals may be provided to at least two rows, and the pixel array 110 may be driven in units of at least two rows.

Under control of the row driver 120, the pixel array 110 may output a plurality of sensing signals through the plurality of column lines CL.

The ADC circuit 130 may perform analog-to-digital conversion on each of a plurality of sensing signals received through the plurality of column lines CL. The ADC circuit 130 may include analog-to-digital converters (hereinafter referred to as ADCs) corresponding to the plurality of column lines CL. Each of the ADCs may convert a sensing signal received through a column line CL corresponding thereto into a pixel value. Depending on an operating mode of the image sensor 110, the pixel value may indicate the amount of light sensed by a subpixel SPX or a pixel PX.

Each of the ADCs may include a correlated double sampling (CDS) circuit for sampling and holding a received signal. The CDS circuit may sample and hold a sensing signal using a CDS method. The CDS circuit may double-sample a noise signal and a sensing signal when a pixel PX or a shared pixel FPX is in a reset state, and output a signal corresponding to the difference between the sensing signal and the noise signal. Each of the ADCs may include a counter. The counter may generate a pixel value by counting signals received from the CDS circuit. For example, the CDS circuit may be embodied as an Operational Transconductance Amplifier (OTA), a differential amplifier, etc. The counter may embodied as an up-counter and operation circuit, an up/down counter, a bit-wise inversion counter, etc.

The timing controller 140 may generate timing control signals for controlling operations of the row driver 120 and the ADC circuit 130. The row driver 120 and the ADC circuit 130 may drive the pixel array 110 in units of rows or at least two rows as described above, based on the timing control signals from the timing controller 140, and convert a plurality of sensing signals received through the plurality of column lines CL into a pixel value.

The image signal processor 150 may receive first image data IDT1, e.g., raw image data, from the ADC circuit 130, and perform signal processing on the first image data IDT1. The image signal processor 150 may perform signal processing such as, for example, black level compensation, lens shading compensation, crosstalk compensation, and bad pixel compensation.

Second image data IDT2, e.g., signal-processed image data, output from the image signal processor 150 may be transmitted to a processor 200. The processor 200 may be a host processor of an electronic device in which the image sensor 100 is mounted. The processor 200 may be, for example, an application processor of a mobile terminal. The image sensor 100 may transmit the second image data IDT2 to the processor 200 according to a data communication method based on a set interface such as, e.g., a Mobile Industry Processor Interface (MIPI).

Figure 3A:
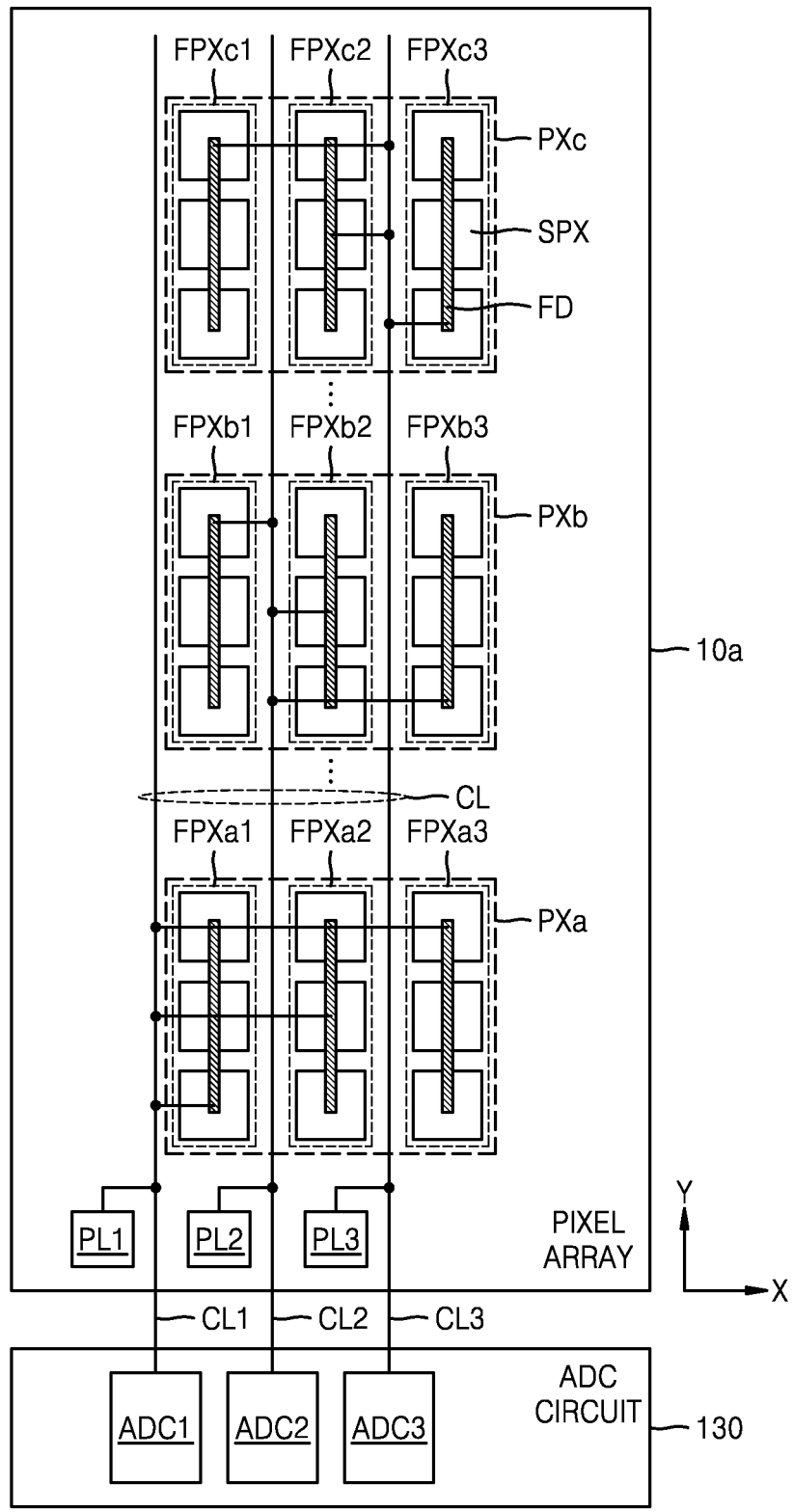
FIGS. 3A and 3B illustrate a structure and an output line connection method of a pixel array according to embodiments of the inventive concept.
Figure 3B:
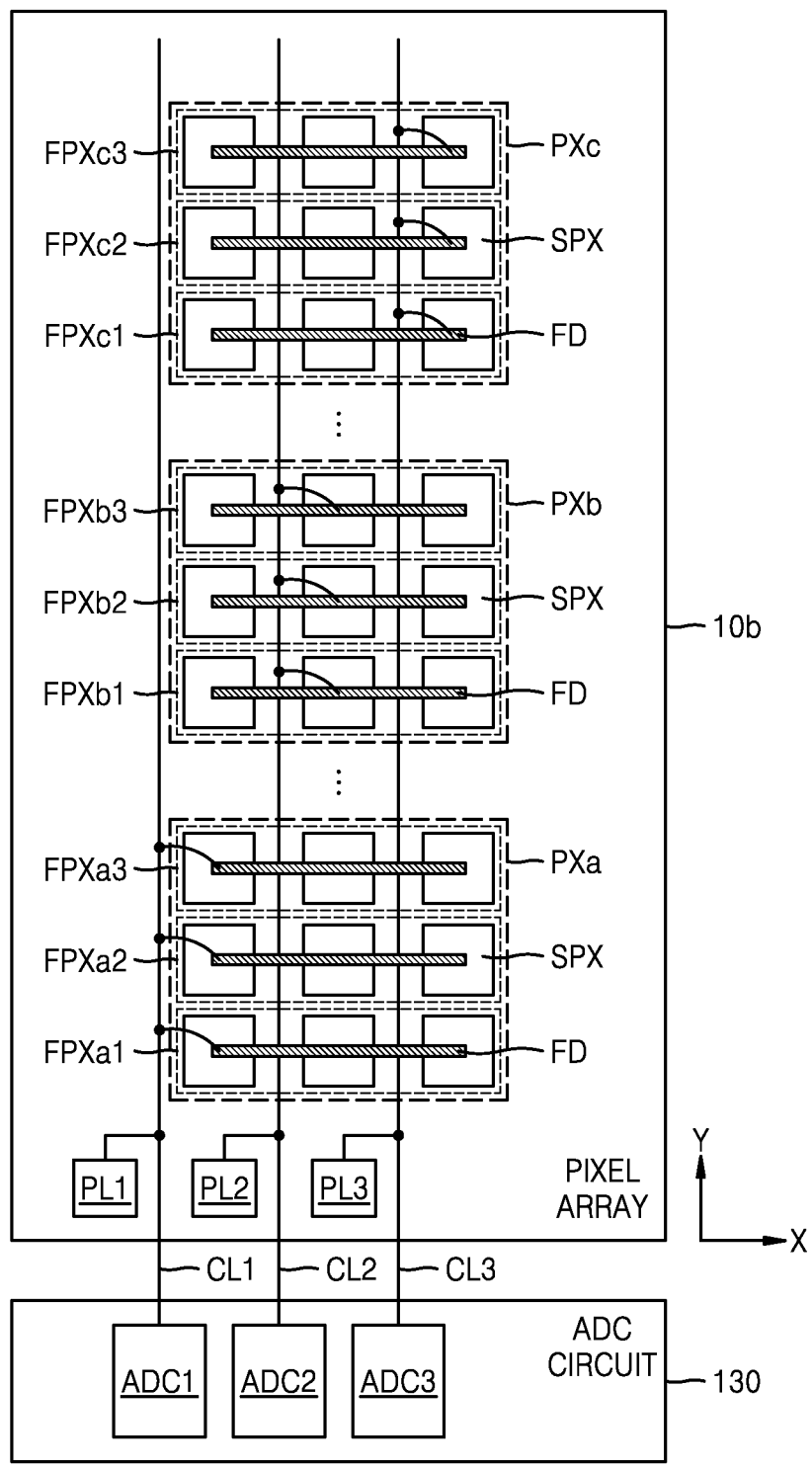

FIGS. 3A and 3B illustrate a structure and an output line connection method of a pixel array according to embodiments of the inventive concept. FIGS. 3A and 3B illustrate the pixel array 10 of FIG. 2A in more detail.

For convenience of explanation, three pixels, e.g., first to third pixels PXa, PXb, and PXc, which are arranged at the same position on an X-axis among a plurality of pixels PX included in the pixel array 10 of FIG. 2A, are illustrated, and column lines CL, e.g., first to third column lines CL1 to CL3, which are connected to the first to third pixels PXa, PXb, and PXc, are illustrated. It is to be understood that additional pixels PX and additional column lines CL are included in embodiments of the inventive concept. The first pixel PXa, the second pixel PXb, and the third pixel PXc may sense optical signals of the same color. Pixels of different colors may be arranged between the first pixel PXa, the second pixel PXb, and the third pixel PXc. For example, the first pixel PXa, the second pixel PXb, and the third pixel PXc may be green pixels, and red or blue pixels may be arranged between the first pixel PXa, the second pixel PXb, and the third pixel PXc.

Referring to FIG. 3A, each of the pixels (e.g., the first pixel PXa, the second pixel PXb, the third pixel PXc) may include nine subpixels SPX arranged in a matrix. Three subpixels SPX consecutively arranged in a second direction (e.g., a Y-axis direction) may share a floating diffusion node FD and be included in the shared pixel FPX. Three shared pixels, e.g., first to third shared pixels FPXa1 to FPXa3, may be consecutively arranged in parallel in a first direction (e.g., an X-axis direction) in the first pixel PXa. Because the second pixel PXb and the third pixel PXc have the same structure as the first pixel PXa, a redundant description thereof is omitted.

The plurality of column lines CL, e.g., first to third column lines CL1 to CL3, extending in the Y-axis direction, may be arranged in parallel in the X-axis direction. Subpixels SPX arranged at the same position on the X-axis may form one column of a pixel array 10a, and one column and one column line CL may be arranged in parallel.

First to third pixel loads PL1 to PL3 may be connected to the first to third column lines CL1 to CL3, respectively. For example, a pixel load PL may be embodied as a current source, and provide a bias current to a shared pixel FPX connected to a column line. The first to third column lines CL1 to CL3 may be respectively connected to a plurality of ADCs, e.g., first to third ADCs ADC1 to ADC3, which are included in the ADC circuit 130.

Three shared pixels FPX included in one pixel PXa, PXb, or PXc may be connected to one of the plurality of column lines CL. For example, the first to third shared pixels FPXa1 to FPXa3 included in the first pixel PXa may be connected to the first column line CL1. A selection transistor SX of FIG. 4 included in each of the first to third shared pixels FPXa1 to FPXa3 may be connected to the first column line CL1, and during a read operation of the pixel array 110a, a sensing signal corresponding to a photocharge stored in the floating diffusion node FD may be output to the first column line CL1 and provided to the first ADC through the first column line CL1, when the sensing transistor SX is turned on.

First to third shared pixels FPXb1 to FPXb3 included in the second pixel PXb may be connected to the second column line CL2, and first to third shared pixels FPXc1 to FPXc3 included in the third pixel PXc may be connected to the third column line CL3.

Referring to FIG. 3B, a pixel PXa may include nine subpixels SPX arranged in a matrix. Three subpixels SPX consecutively arranged in a first direction (e.g., an X-axis direction) may share a floating diffusion node FD and may be included in a shared pixel FPX. The three shared pixels FPX, for example, first to third shared pixels FPXa1 to FPXa3, may be consecutively arranged in parallel in a second direction (e.g., a Y-axis direction). A pixel PXb and a pixel PXc may have the same structure as the pixel PXa, and a redundant description thereof will be omitted.

Three shared pixels FPX included in one pixel PXa, PXb, or PXc may be connected to one column line CL, and shared pixels FPX included in different pixels PX may be connected to different column lines CL.

As described above with reference to FIGS. 3A and 3B, in the pixel arrays 10a and 10b according to embodiments of the inventive concept, a plurality of shared pixels FPX included in one pixel PXa, PXb, or PXc may be connected to one of a plurality of column lines CL and sense optical signals of the same color, and a plurality of pixels PX, e.g., pixels PXa, PXb, and PXc, which are arranged adjacent to each other at the same position on the X-axis, may be connected to different column lines CL.

Figure 4:
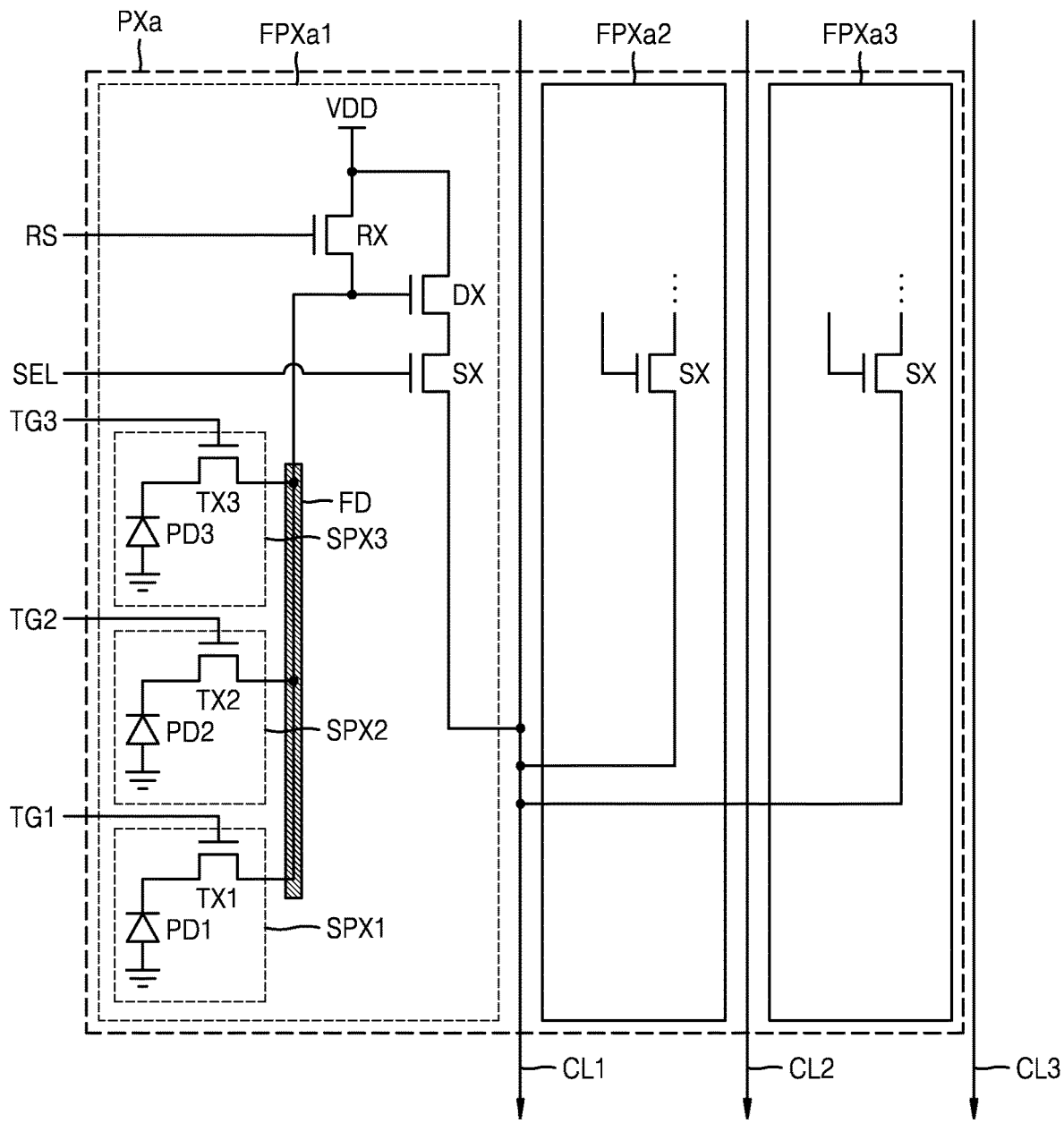
FIG. 4 is a circuit diagram illustrating a pixel structure of a pixel array according to an embodiment of the inventive concept.

FIG. 4 is a circuit diagram illustrating a pixel structure of a pixel array according to an embodiment of the inventive concept. FIG. 4 illustrates an equivalent circuit of the pixel PXa of FIG. 3A or 3B.

Referring to FIG. 4, a pixel PXa may include first to third shared pixels FPXa1 to FPXa3.

The first shared pixel FPXa1 may include a plurality of photodiodes, e.g., a first photodiode PD1, a second photodiode PD2, and a third photodiode PD3, and a plurality of transmission transistors, e.g., a first transmission transistor TX1, a second transmission transistor TX2, and a third transmission transistor TX3, corresponding to the plurality of photodiodes. The first shared pixel FPXa1 may include a floating diffusion node FD and a plurality of read elements, such as, e.g., a reset transistor RX, a driving transistor DX, and a selection transistor SX.

The first transmission transistor TX1, the second transmission transistor TX2, the third transmission transistor TX3, the reset transistor RX, the driving transistor DX, and the selection transistor SX may be operated, e.g., turned on or off, in response to a plurality of control signals, e.g., first to third transmission control signals TG1 to TG3, a reset signal RS, and a selection signal SEL, which are received from the row driver 120 of FIG. 1 through the plurality of row lines RL of FIG. 1.

The first photodiode PD1 and the first transmission transistor TX1 may be included in a first subpixel SPX1, the second photodiode PD2 and the second transmission transistor TX2 may be included in a second subpixel SPX2, and the third photodiode PD3 and the third transmission transistor TX3 may be included in a third subpixel SPX3.

The first subpixel SPX1, the second subpixel SPX2, and the third subpixel SPX3 may share a floating diffusion node FD (also referred to as a floating diffusion region) and a plurality of read elements. In other words, photocharges generated by the first photodiode PD1, the second photodiode PD2, and the third photodiode PD3 may be stored in the floating diffusion node FD, and a sensing signal corresponding to the photocharges stored in the floating diffusion node FD may be output through the selection transistor SX.

Each of the first photodiode PD1, the second photodiode PD2, and the third photodiode PD3 may generate photocharges that vary according to the intensity of incident light. For example, each of the first photodiode PD1, the second photodiode PD2, and the third photodiode PD3 may be a P-N junction diode and may generate charges, e.g., electrons that are negative electrons and holes that are positive charges, to be proportional to the amount of incident light.

The floating diffusion node FD may operate as a capacitor. When the first transmission transistor TX1 is turned on in response to the first transmission control signal TG1 supplied to a gate terminal thereof, charges (e.g., photocharges) generated by the first photodiode PD1 may be transmitted to and stored in the floating diffusion node FD. When the second transmission transistor TX2 is turned on in response to the second transmission control signal TG2 supplied to a gate terminal thereof, photocharges generated by the second photodiode PD2 may be transmitted to and stored in the floating diffusion node FD. When the third transmission transistor TX3 is turned on in response to the third transmission control signal TG3 supplied to a gate terminal thereof, photocharges generated by the third photodiode PD3 may be transmitted to and stored in the floating diffusion node FD.

The first transmission control signal TG1, the second transmission control signal TG2, and the third transmission control signal TG3 may be different signals, and thus, turn-on timings of the first transmission transistor TX1, the second transmission transistor TX2, and the third transmission transistor TX3 may be independently and respectively controlled by the first transmission control signal TG1, the second transmission control signal TG2, and the third transmission control signal TG3.

The reset transistor RX may periodically reset charges accumulated in the floating diffusion node FD. A source electrode of the reset transistor RX may be connected to the floating diffusion node FD, and a drain electrode thereof may be connected to a power supply voltage VDD. When the reset transistor RX is turned on in response to a reset control signal RS supplied to a gate terminal thereof, the power supply voltage VDD connected to the drain electrode of the reset transistor RX is applied to the floating diffusion node FD. When the reset transistor RX is turned on, charges accumulated in the floating diffusion node FD are discharged, thereby resetting the floating diffusion node FD.

The driving transistor DX may operate as a source follower. The driving transistor DX may receive a signal according to the amount of charges accumulated in the floating diffusion node FD, that is, a potential of the floating diffusion node FD, through a gate terminal thereof, buffer the received signal, and output a sensing signal. The selection transistor SX may be connected to a first column line CL1. The selection transistor SX may be turned on in response to the first selection signal SEL supplied to a gate terminal thereof, and when the selection transistor SX is turned on, a sensing signal output from the driving transistor DX may be output to the first column line CL1.

Structures and operations of the second shared pixel FPXa2 and the third shared pixel FPXa3 are similar to the structure and operation of the first shared pixel FPXa1, and a repeated description thereof is omitted. Each of the second shared pixel FPXa2 and the third shared pixel FPXa3 may receive a plurality of control signals and operate in response thereto. The plurality of control signals provided to each of the first to third shared pixels FPXa1 to FPXa3 may be different signals, and the first shared pixel FPXa1, the second shared pixel FPXa2, and the third shared pixel FPXa3 may operate independently.

Selection transistors SX of the second shared pixel FPXa2 and the third shared pixel FPXa3 may also be connected to the first column line CL1. The selection transistors SX of the first to third shared pixels FPXa1 to FPXa3 may operate in response to different selection signals SEL. Accordingly, the selection transistors SX of the first to third shared pixels FPXa1 to FPXa3 may be independently controlled, and timings at which the first to third shared pixels FPXa1 to FPXa3 output sensing signals may be different or the same.

Figure 5:
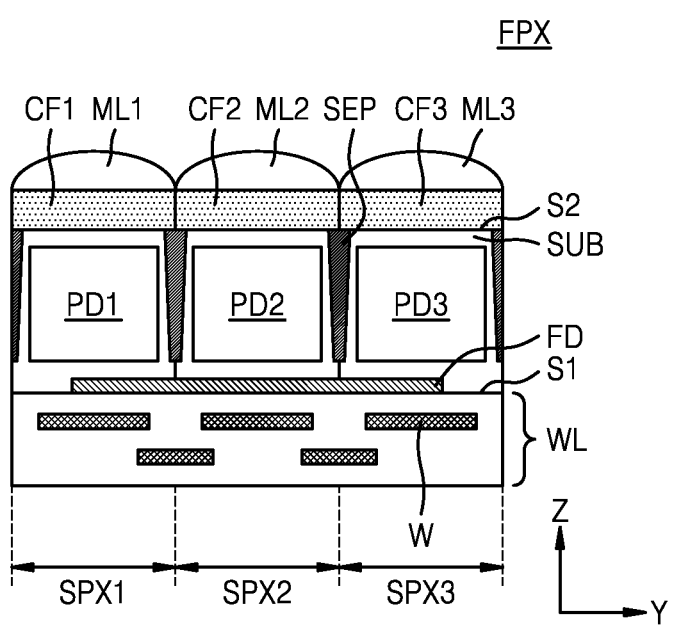
FIG. 5 is a vertical cross-sectional view illustrating a shared pixel of a pixel array according to an embodiment of the inventive concept.

FIG. 5 is a vertical cross-sectional view illustrating a shared pixel of a pixel array according to an embodiment of the inventive concept.

Referring to FIG. 5, a shared pixel FPX may include three subpixels, e.g., a first subpixel SPX1, a second subpixel SPX2, and a third subpixel SPX3, which are consecutively arranged in a second direction (e.g., a Y-axis direction). However, embodiments of the inventive concept are not limited thereto. For example, according to embodiments of the inventive concept, a plurality of subpixels may be arranged in the second direction and a first direction perpendicular to the second direction (e.g., an X-axis direction perpendicular to the Y-axis).

The first subpixel SPX1 may include a first photodiode PD1, a first color filter CF1, and a first microlens ML1. The second subpixel SPX2 may include a second photodiode PD2, a second color filter CF2, and a second microlens ML2. The third subpixel SPX3 may include a third photodiode PD3, a third color filter CF3, and a third microlens ML3. The first to third color filters CF1 to CF3 may transmit light of the same color.

A substrate SUB may be, for example, a silicon wafer, a silicon-on-insulator (SOI) substrate, or a semiconductor epitaxial layer. The substrate SUB may include a first surface S1 and a second surface S2, which face each other. For example, the first surface S1 may be a front surface of the substrate SUB, and the second surface S2 may be a rear surface of the substrate SUB.

In an embodiment, the first to third photodiodes PD1 to PD3 may be provided on the substrate SUB, and the first to third color filters CF1 to CF3 and the first to third microlenses ML1 to ML3 may be stacked in a direction perpendicular to the second surface S2 of the substrate SUB, e.g., in a Z-axis direction. Accordingly, an optical signal may be incident on the second surface S2 of the substrate SUB.

A plurality of pixel isolation films (SEP) (e.g., deep trench isolation (DTI) or P-type ion implantation regions) may extend from the second surface S2 of the substrate SUB toward the first surface S1. The first to third subpixels SPX1 to SPX3 may be divided by the plurality of SEPs.

The first to third subpixels SPX1 to SPX3 may share a floating diffusion node FD. The floating diffusion node FD may extend in the direction, e.g., the second direction (e.g., the Y-axis direction) in which the first to third subpixels SPX1 to SPX3 are arranged. In an embodiment, the floating diffusion node FD may be formed in the substrate SUB. However, embodiments of the inventive concept are not limited thereto.

Active regions of the first to third transmission transistors TX1, TX2, and TX3 of FIG. 4 that transmit photocharges generated by the first photodiode PD1, the second photodiode PD2, and the third photodiode PD3, which are included in each of the first to third subpixels SPX1 to SPX3, to the floating diffusion node FD, and the read elements RX, DX, and SX of FIG. 4, may be provided on the second surface S2 of the substrate SUB.

Interconnections W for connecting the first to third transmission transistors TX1, TX2, and TX3 of FIG. 4 and the read elements RX, DX, and SX of FIG. 4, row lines for providing control signals to the first to third transmission transistors TX1, TX2, and TX3 and the read elements RX, DX, and SX, and a column line connected to the shared pixel FPXa, may be provided in an interconnection layer WL.

Figure 6A:
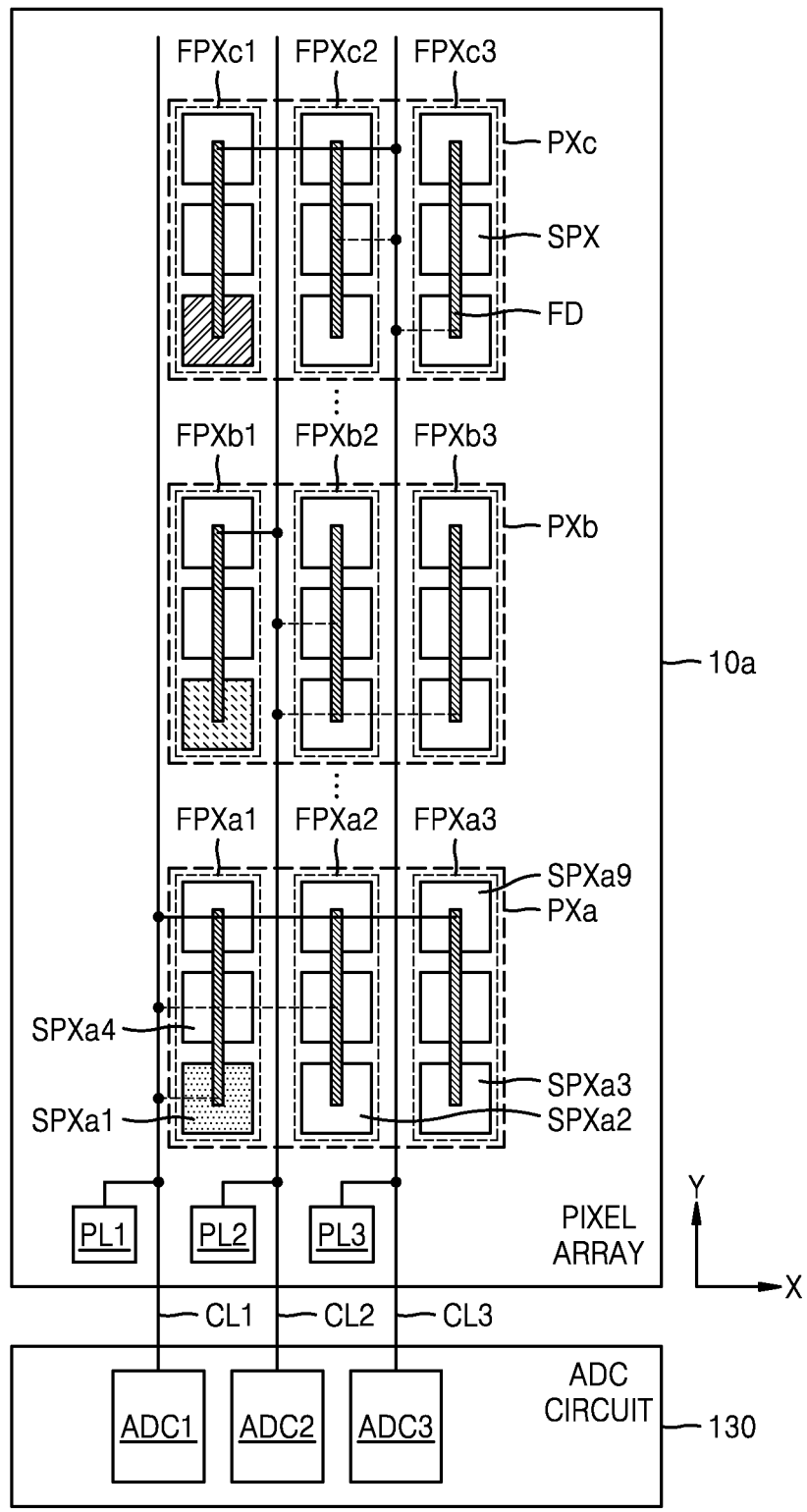
FIGS. 6A and 6B illustrate a reading method of a pixel array according to an embodiment of the inventive concept.
Figure 6B:
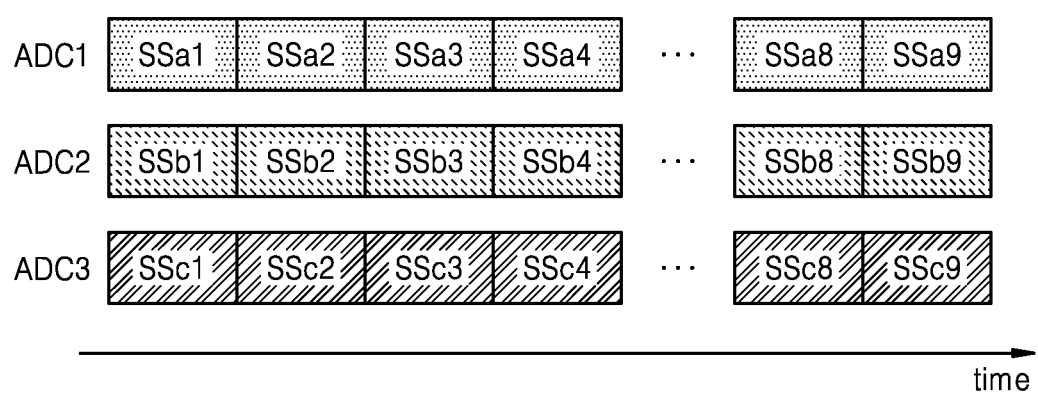

FIGS. 6A and 6B illustrate a reading method of a pixel array according to an embodiment of the inventive concept. FIG. 6A illustrates that pixels PXa to PXc are read in units of subpixels SPX from a pixel array 10a. In the disclosure, reading a subpixel should be understood to mean that a sensing signal corresponding to a photocharge generated in the subpixel is output and converted into a pixel value. FIG.

6B illustrates sensing signals converted into pixel values by a first ADC ADC1 to a third ADC ADC3.

Referring to FIGS. 6A and 6B, pixels PXa to PXc may be respectively connected to first to third column lines CL1 to CL3, and the first to third ADCs ADC1 to ADC3 may be respectively connected to the first to third column lines CL1 to CL3. Accordingly, sensing signals may be simultaneously output from the pixels PXa to PXc and converted into pixel values. For example, three sensing signals output from the pixels PXa to PXc may be respectively transmitted to the first to third ADCs ADC1 to ADC3 through first to third column lines CL1 to CL3. The first to third ADCs ADC1 to ADC3 may convert the received three sensing signals into three pixel values.

In this case, nine sensing signals may be sequentially output from nine subpixels SPX included in each of the pixels PXa to PXc, and sequentially converted into nine pixel values through one ADC. For example, a first sensing signal may be output from a first subpixel SPXa1 of the pixel PXa. Next, a second sensing signal and a third sensing signal may be sequentially output from a second subpixel SPXa2 and a third subpixel SPXa3 of the pixel PXa. Thereafter, a fourth sensing signal may be output from a fourth subpixel SPXa4 of the pixel PXa. The output sensing signals may be sequentially converted into pixel values by the first ADC ADC1. As described above, nine sensing signals may be sequentially output from the first subpixel SPXa1 to a ninth subpixel SPXa9 of the pixel PXa and converted into pixel values.

As described above with reference to FIG. 4, first to third shared pixels FPXa1 to FPXa3 of the pixel PXa may receive different selection signals SELs of FIG. 4. A selection transistor SX of a shared pixel that outputs a sensing signal may be turned on and selection transistors SX of other shared pixels may be turned off. For example, when a sensing signal corresponding to a photocharge generated in a first subpixel SPXa1 is output from the first shared pixel FPXa1, the selection transistor SX of FIG. 4 of the first shared pixel FPXa1 may be turned on and the selection transistors SX of the second shared pixel FPXa2 and the third shared pixel FPXa3 may be turned off.

Operations of the pixel PXb and the pixel PXc may be the same as the operation of the pixel PXa, and a repeated description thereof is omitted. For example, the pixels PXa, PXb, and PXb may receive a plurality of same control signals and operate equally at the same point in time in response thereto.

Referring to FIG. 6B, the first ADC ADC1 may sequentially convert sensing signals SSa1 to SSa9 output from the pixel PXa into pixel values, the second ADC ADC2 may sequentially convert sensing signals SSb1 to SSb9 output from the pixel PXb into pixel values, and the third ADC ADC3 may sequentially convert sensing signals SSc1 to SSc9 output from the pixel PXc into pixel values. Accordingly, nine pixel values may be generated with respect to each of the pixels PXa, PXb, and PXc.

Figure 7A:
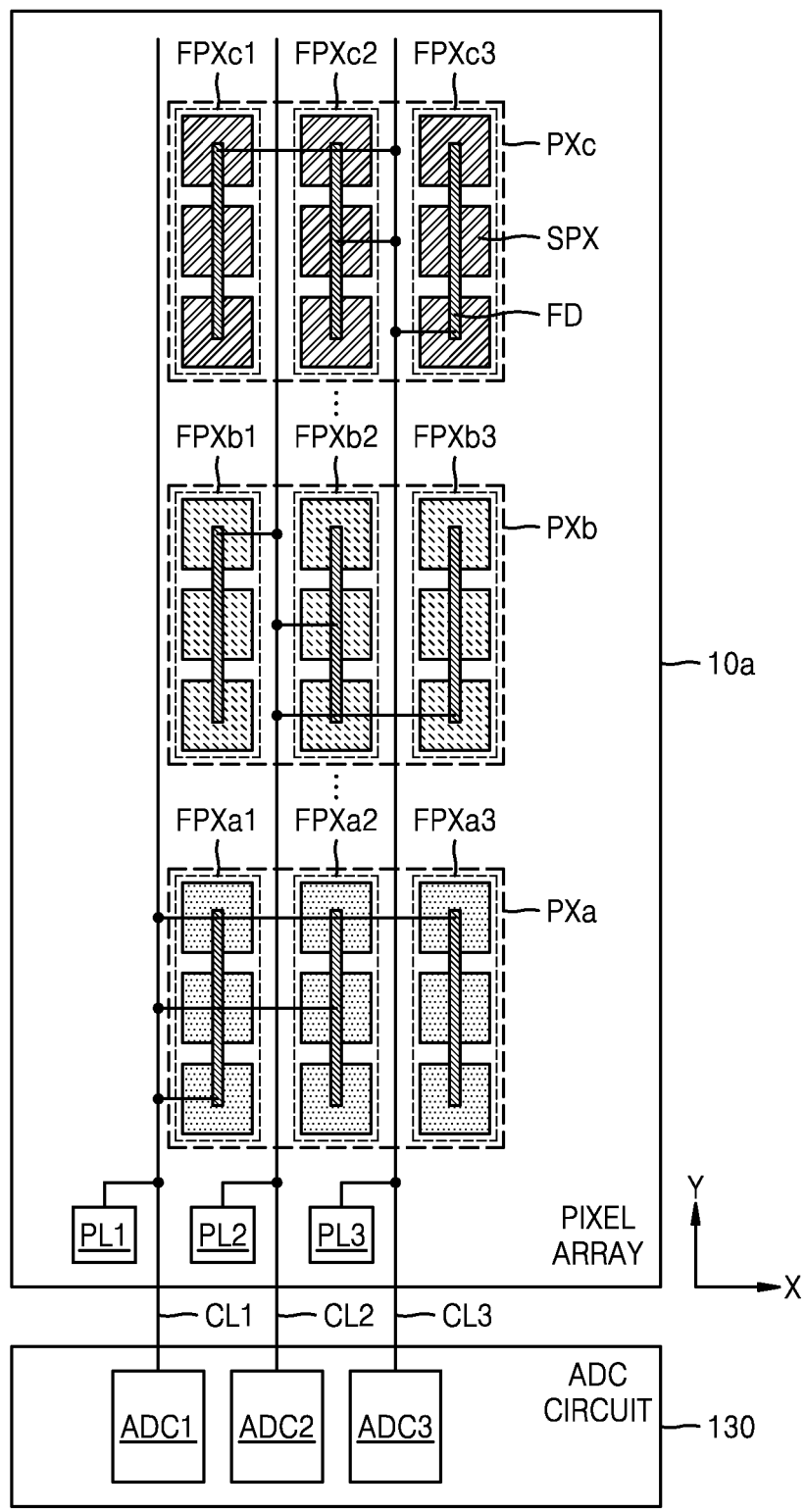
FIGS. 7A and 7B illustrate a reading method of a pixel array according to an embodiment of the inventive concept.
Figure 7B:
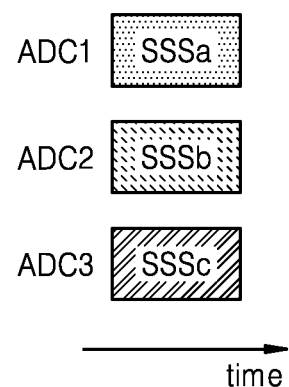

FIGS. 7A and 7B illustrate a reading method of a pixel array according to an embodiment of the inventive concept. FIG. 7A illustrates that pixels PXa to PXc are read in pixel units from a pixel array 10a. In the disclosure, performing reading in units of pixels should be understood to mean that a combination of sensing signals in pixels is output and converted into pixel values. FIG. 7B illustrates sensing signals converted into pixel values by a first ADC ADC1 to a third ADC ADC3.

Referring to FIGS. 7A and 7B, combined sensing signals SSa, SSb, and SSc may be output from pixels PXa to PXc and transmitted to the first to third ADCs ADC1 to ADC3, respectively, and the first to third ADCs ADC1 to ADC3 may convert the three combined sensing signals SSa, SSb, and SSc into three pixel values.

For example, the first to third transmission transistors TX1 to TX3 of FIG. 4 respectively included in first to third shared pixels FPXa1 to FPXa3 of the pixel PXa may turned on at about the same time, and photocharges generated by the first to third photodiodes PD1 to PD3 of FIG. 4 may be transmitted to and stored in a floating diffusion node FD. A sensing signal according to a potential of the floating diffusion node FD, that is, a sensing signal corresponding to the total amount of the photocharges generated by the first to third photodiodes PD1 to PD3, may be output. The selection transistor (e.g., SX of FIG. 4) included in each of the first to third shared pixels FPXa1 to FPXa3 may be turned on, and sensing signals may be output from each of the first to third shared pixels FPXa1 to FPXa3. An average value (or a largest value) of the three sensing signals output from the first to third shared pixels FPXa1 to FPXa3 may be provided as a combined sensing signal to the first ADC ADC1 through a first column line CL1.

Operations of the pixel PXb and the pixel PXc are the same as that of the pixel PXa, and the three combined sensing signals SSSa, SSSb, and SSSc simultaneously output from the pixels PXa to PXc may be converted into three pixel values by the first to third ADCs ADC1 to ADC3.

In the pixel array 10a, a plurality of pixels (e.g., the pixels PXa, PXb, and PXc) may output sensing signals in subpixel units and convert the sensing signals into pixel values as described above with reference to FIGS. 6A and 6B, or may output sensing signals in units of pixels and convert the sensing signals into pixel values as described above with reference to FIGS. 7A and 7B.

The image sensor 100 of FIG. 1 according to an embodiment of the inventive concept may generate pixel values in units of sub pixels in a first read mode, and generate pixel values in units of pixels in a second read mode. For example, in a high-illumination environment such as daytime, the image sensor 100 may operate in the first read mode to generate a high-resolution image, and in a low-light environment such as nighttime, the image sensor 100 may operate in the second read mode to generate an image that does not deteriorate in quality even in the low-light environment.

Figure 8A:
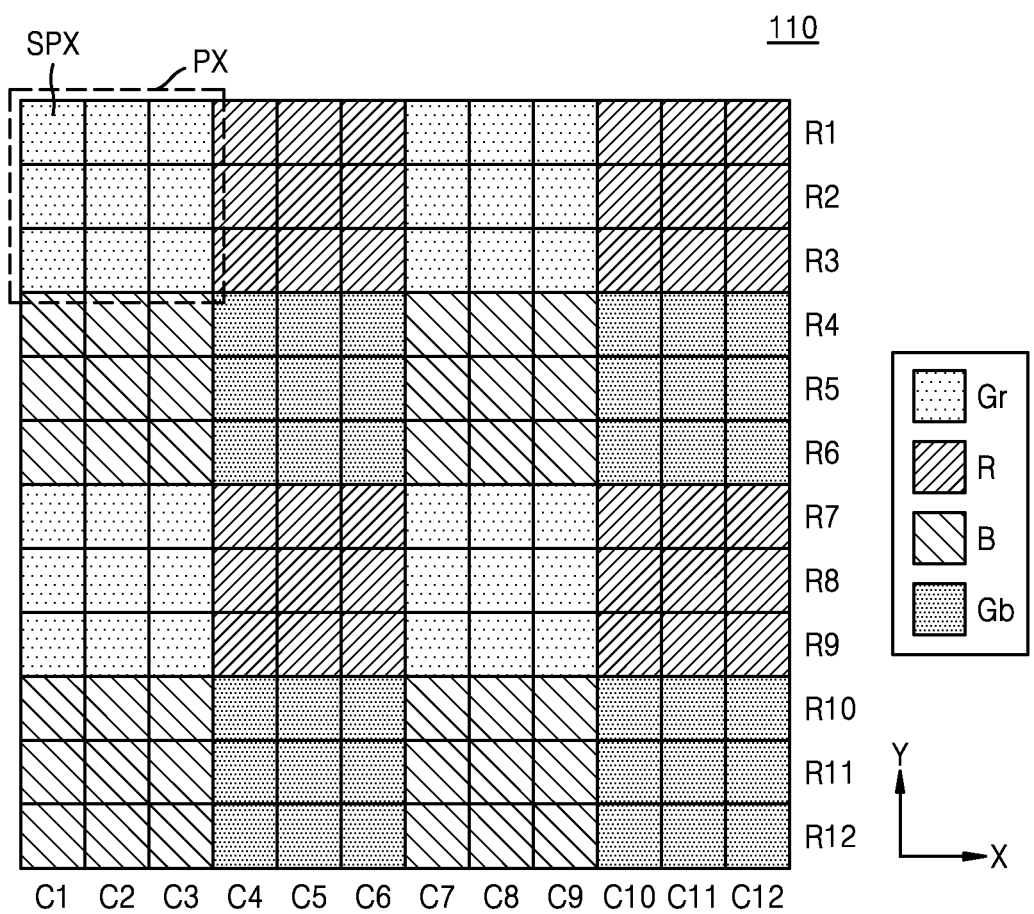
FIGS. 8A to 8C illustrate image data generated when an image sensor operates in a first read mode and a second read mode according to an embodiment of the inventive concept.
Figure 8B:
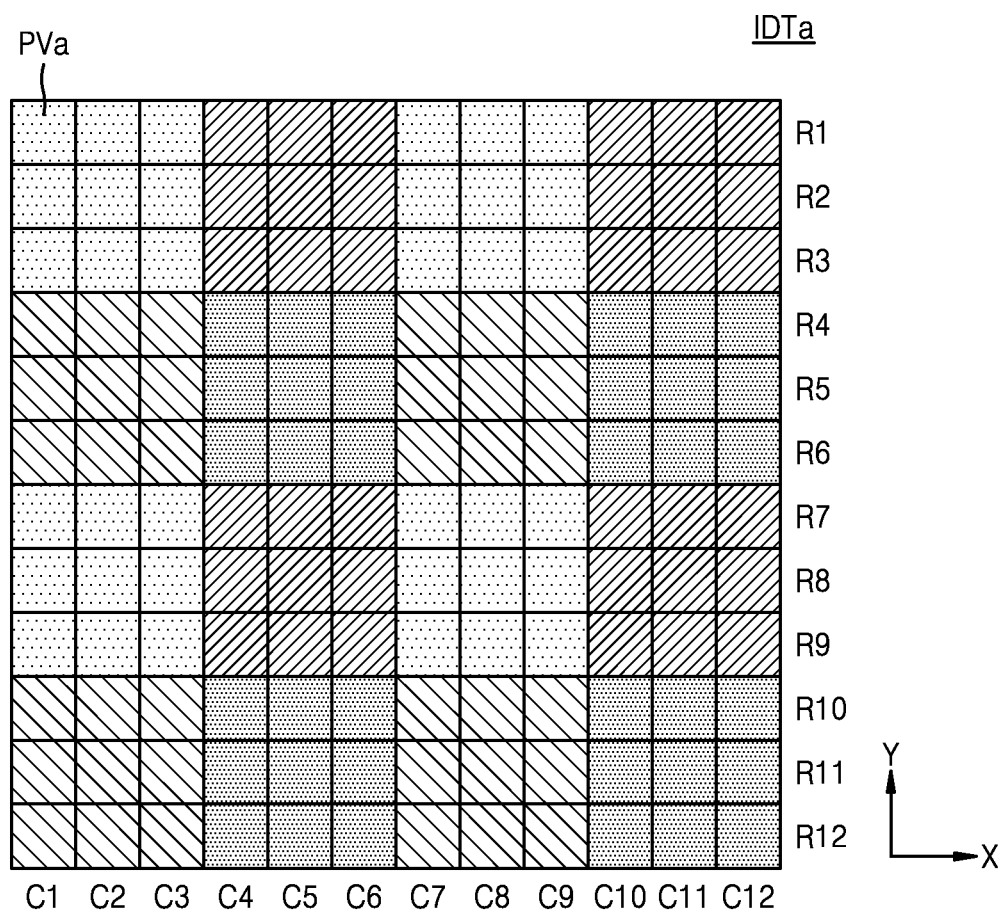
Figure 8C:
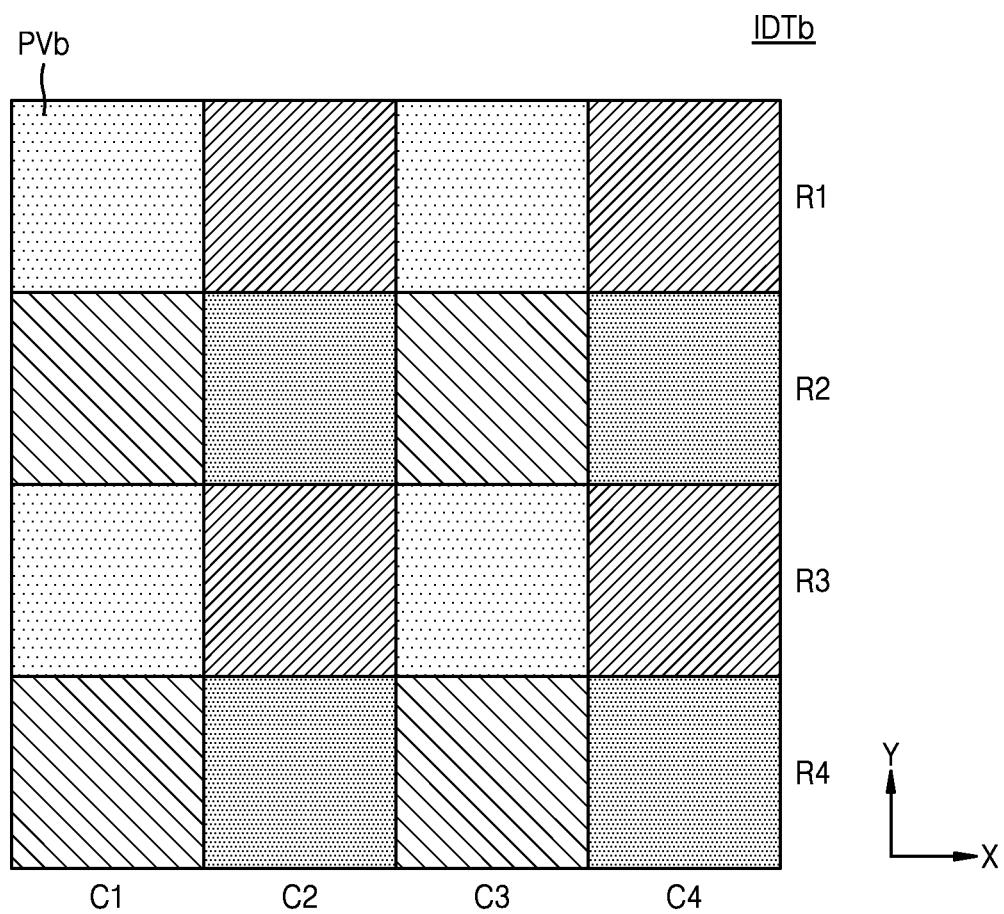

FIGS. 8A to 8C illustrate image data generated when an image sensor operates in the first read mode and the second read mode according to an embodiment of the inventive concept.

FIG. 8A illustrates a pixel array 110 included in an image sensor. FIG. 8B illustrates image data IDTa generated in the first read mode. FIG. 8C illustrates image data IDTb generated in the second read mode.

Referring to FIG. 8A, in the pixel array 110, a plurality of subpixels SPX may be arranged in a matrix and divided into a plurality of pixels PX. Although, for convenience of description, FIG. 8A illustrates that 144 subpixels SPX are arranged in a matrix in first to twelfth columns C1 to C12 and first to twelfth rows R1 to R12, and divided into nine pixels PX, the number of subpixels SPX and the number of pixels PX may vary according to a resolution and type of the pixel array 110 according to embodiments of the inventive concept.

Nine subpixels SPX included in a pixel PX may sense an optical signal of the same color. In other words, the nine subpixels SPX included in the pixel PX may include color filters of the same color. A first green pixel Gr, a red pixel R, a blue pixel B, and a second green pixel Gb may be arranged in a matrix to be adjacent to each other, and a combination of the first green pixel Gr, the red pixel R, the blue pixel B, and the second green pixel Gb may be repeatedly arranged in the pixel array 110 in a first direction (e.g., an X-axis direction) and a second direction (e.g., a Y-axis direction).

Referring to FIG. 8B, when the image sensor 100 operates in a first mode, the image data IDTa may include a pixel value PVa corresponding to the subpixel SPX. For example, the image data IDTa may include 144 pixel values PVa corresponding to positions of the 144 subpixels SPX of the pixel array 110. Each of the 144 pixel values PXa may represent a photocharge generated in the subpixel SPX. Nine pixel values PXa in a 3×3 matrix may represent pixel values of the same color. In an embodiment, the image data IDTa may be raw image data (e.g., the first image data IDT1 of FIG. 1), and the image signal processor 150 of FIG. 1 may perform signal processing to rearrange the 144 pixel values PXa, e.g., in a remosaic pattern, such that values of adjacent pixels PXa represent different colors.

Referring to FIG. 8C, when the image sensor 100 operates in a second mode, the image data IDTb may include a pixel value PVb corresponding to the pixel PX. For example, the image data IDTb may include 16 pixel values PVb respectively corresponding to positions of 16 subpixels PX of the pixel array 110. As described above with reference to FIG. 7A, a sensing signal corresponding to the total amount of photocharges generated in three subpixels SPX included in each of three shared pixels may be output from each of the three shared pixels. An average value of the three sensing signals output from the three shared pixels may be converted into a pixel value PVb.

Figure 9:
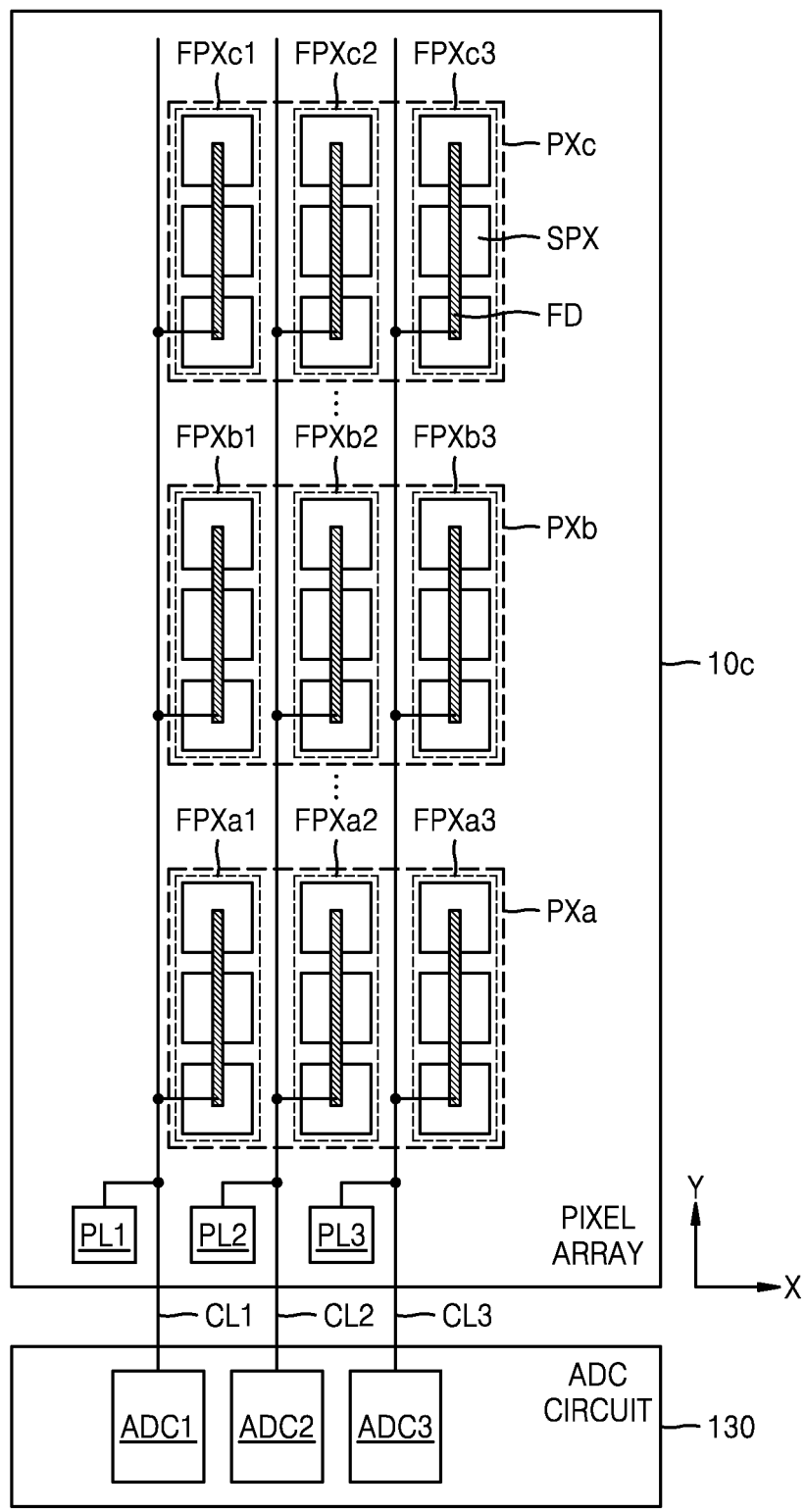
FIG. 9 illustrates a structure and an output line connection method of a pixel array according to embodiments of the inventive concept.

FIG. 9 illustrates a structure and an output line connection method of a pixel array according to embodiments of the inventive concept.

A structure of a pixel array 10c of FIG. 9 is similar to the structure of the pixel array 10a of FIG. 3A, and for convenience of explanation, a repeated description of elements and aspects previously described will be omitted. However, in the pixel array 10c of FIG. 9, three shared pixels FPXa1 to FPXa3, FPXb1 to FPXb3, and FPXc1 to FPXc3 respectively included in one pixel PXa, PXb, and PXc may be respectively connected to first to third column lines CL1 to CL3. Accordingly, the pixels PXa, PXb, and PXc may be connected to the first to third column lines CL1 to CL3.

Figure 10A:
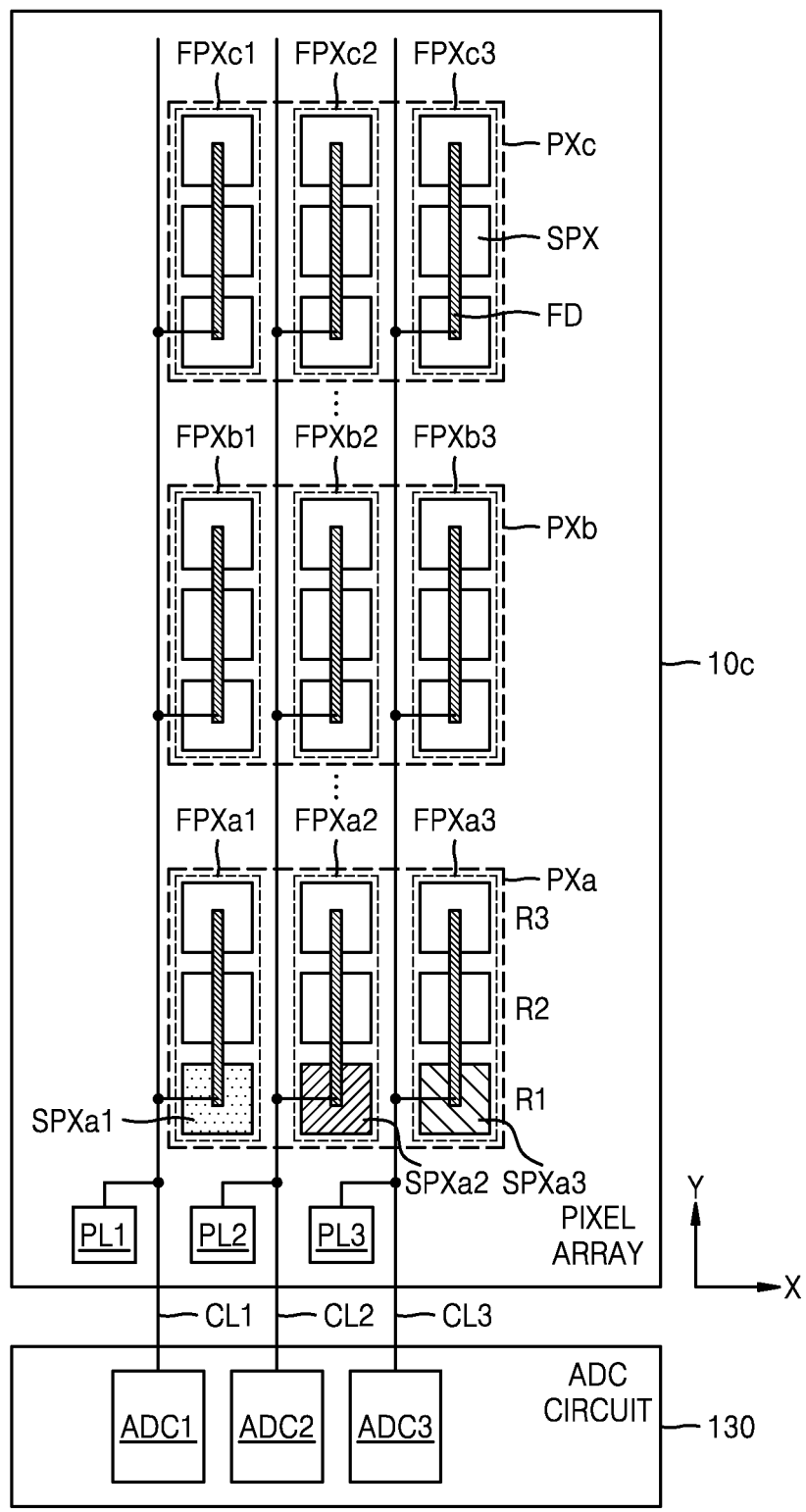
FIGS. 10A and 10B illustrate a reading method of a pixel array according to an embodiment of the inventive concept.
Figure 10B:
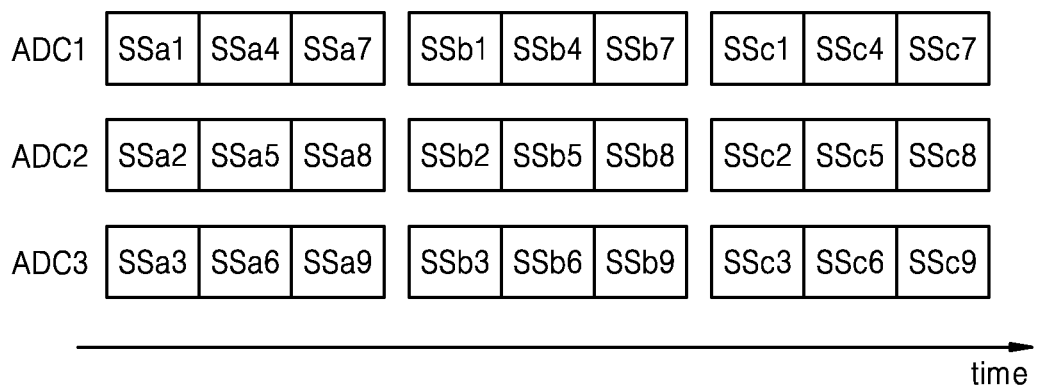

FIGS. 10A and 10B illustrate a reading method of a pixel array according to an embodiment of the inventive concept. FIG. 10A illustrates that in a pixel array 10c, pixels PXa to PXc are read in units of subpixels SPX. FIG. 10B illustrates sensing signals converted into pixel values by a first ADC ADC1 to a third ADC ADC3.

Referring to FIG. 10A, when the image sensor 110 operates in a first mode, three subpixels, e.g., first to third subpixels SPXa1 to SPXa3, arranged in a row of one pixel, e.g., a pixel PXa, may be simultaneously read. Three sensing signals output from the first to third subpixels SPXa1 to SPXa3 may be respectively transmitted to first to third ADCs ADC1 to ADC3 through first to third column lines CL1 to CL3, and converted into three pixel values by the first to third ADCs ADC1 to ADC3.

Thereafter, three subpixels arranged in a subsequent row may be read. In this manner, after subpixels SPX arranged in three rows of the pixel PXa are sequentially read, subpixels SPX arranged in a row of each of the pixels PXb and PXc may be sequentially read.

Referring to FIG. 10B, the first to third ADCs ADC1 to ADC3 may convert first to third sensing signals SSa1 to SSa3 output from subpixels, e.g., the first to third subpixels SPXa1 to SPXa3, arranged in a first row R1 of the pixel PXa, into pixel values. Thereafter, the first to third ADCs ADC1 to ADC3 may receive fourth to sixth sensing signals SSa4 to SSa6 from subpixels arranged in a second row R2 of the pixel PXa, and convert the fourth to sixth sensing signals SSa4 to SSa6 into pixel values. Lastly, the first to third ADCs ADC1 to ADC3 may receive seventh to ninth sensing signals SSa7 to SSa9 from subpixels arranged in a third row R3 of the pixel PXa and convert the seventh to ninth sensing signals SSa7 to SSa9 into pixel values.

Thereafter, the first to third ADCs ADC1 to ADC3 may receive first to ninth sensing signals SSb1 to SSb9 from the pixel PXb and convert the first to ninth sensing signals SSb1 to SSb9 into pixel values in units of three sensing signals, and receive first to ninth sensing signals SSc1 to SSc9 from the pixel PXc and convert the first to ninth sensing signals SSc1 to SSc9 into pixel values in units of three sensing signals. Accordingly, nine pixel values may be generated with respect to each of the pixels PXa, PXb, and PXc.

Figure 11A:
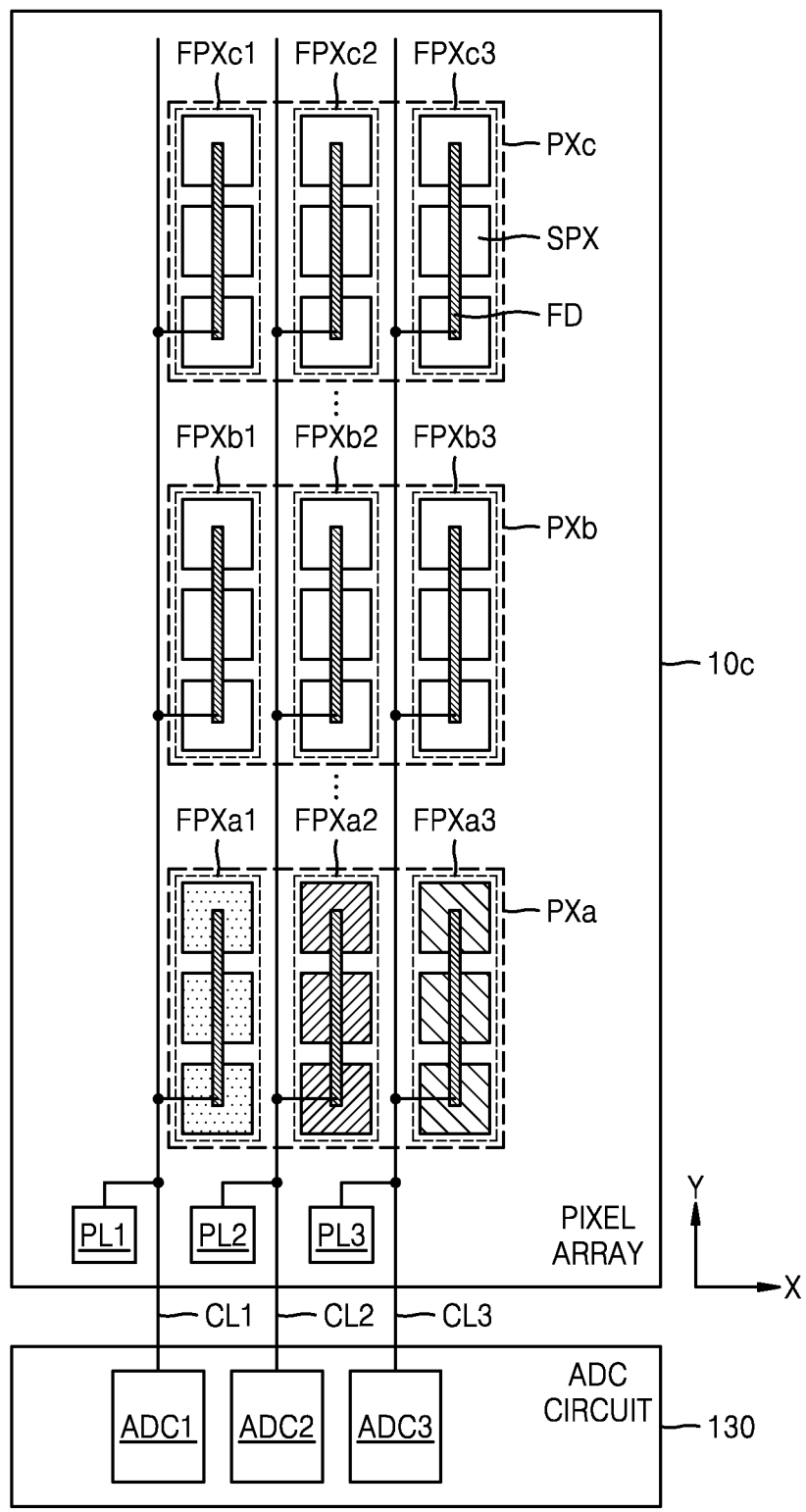
FIGS. 11A and 11B illustrate a reading method of a pixel array according to an embodiment of the inventive concept.
Figure 11B:
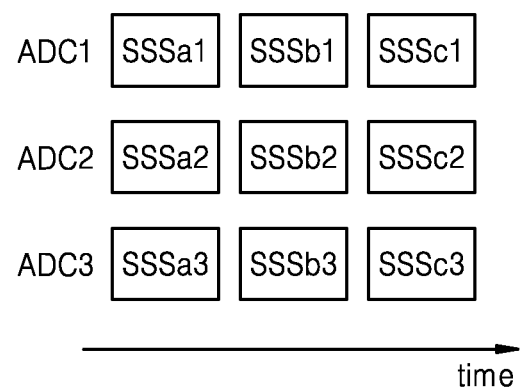

FIGS. 11A and 11B illustrate a reading method of a pixel array according to an embodiment of the inventive concept. FIG. 11A illustrates that in the pixel array 10c of FIG. 9, the pixels PXa to PXc are read in units of pixels. FIG. 11B illustrates sensing signals converted into pixel values by a first ADC ADC1 to a third ADC ADC3.

Referring to FIGS. 11A and 11B, when the image sensor 110 operates in a second mode, three shared pixels, e.g., first to third shared pixels FPXa1 to FPXa3, which are included in one pixel, e.g., the pixel PXa, may be simultaneously read. Three combined sensing signals SSSa1, SSSa2, and SSSa3 output from the first to third shared pixels FPXa1 to FPXa3 may be transmitted to first to third ADCs ADC1 to ADC3 through first to third column lines CL1 to CL3, respectively. The combined sensing signal SSSa1, SSSa2, and SSSa3 may have a value representing the total amount of photocharges generated by the first to third photodiodes PD1 to PD3 of FIG. 4 included in each of the shared pixels FPXa1, FPXa2 and FPXa3. The three combined sensing signals SSSa1, SSSa2, and SSSa3 may be respectively analog-to-digital converted by the first to third ADCs ADC1 to ADC3, and an average value of three values obtained by the conversion may be generated as a pixel value corresponding to the pixel PXa.

Thereafter, three combined sensing signals SSSb1, SSSb2, and SSSb3 may be output from the pixel PXb and a pixel value corresponding to the pixel PXb may be generated, and three combined sensing signals SSSc1, SSSc2, and SSSc3 may be output from the pixel PXc and a pixel value corresponding to the pixel PXc may be generated in the above-described manner.

Figure 12:
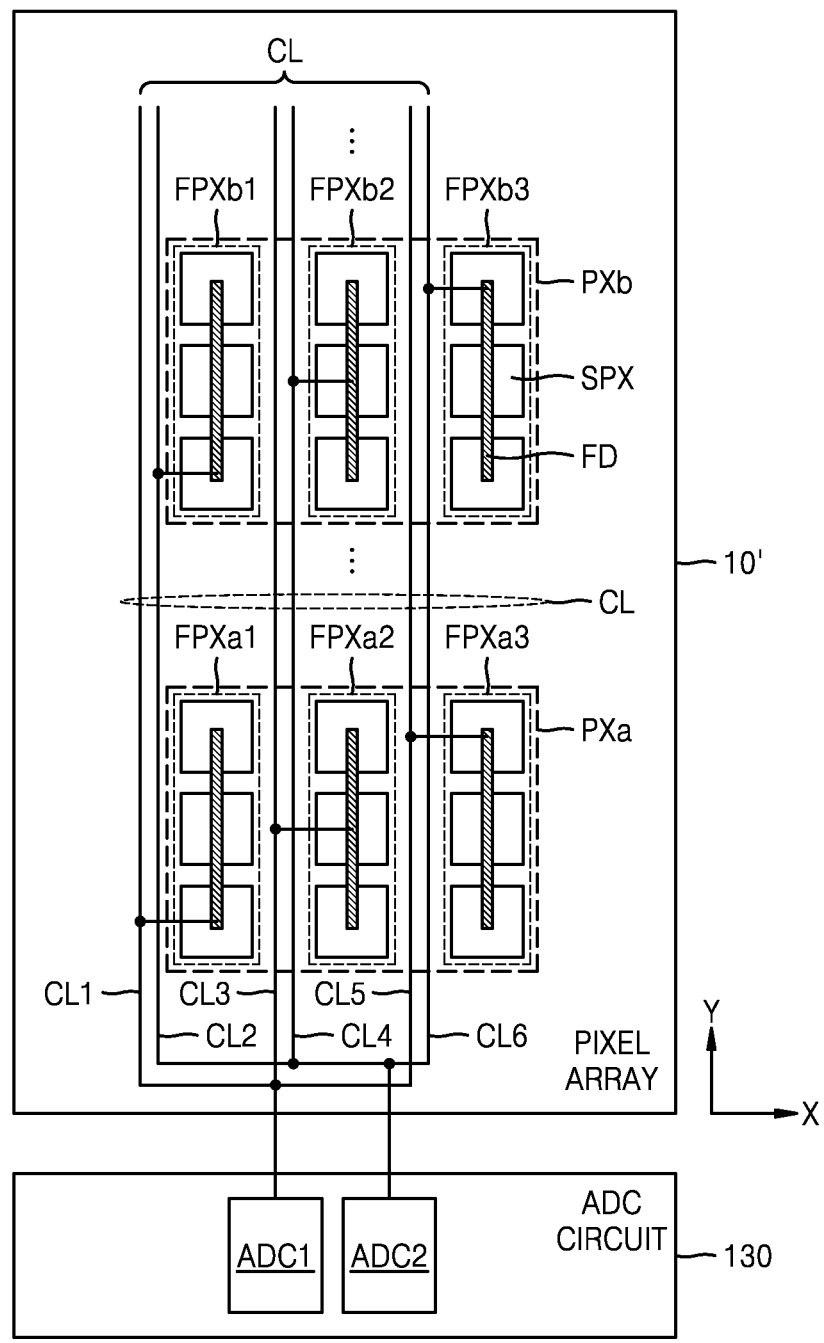
FIG. 12 illustrates a comparative example of the structure and the output line connection method of the pixel array illustrated in FIG. 3A.

FIG. 12 illustrates a comparative example of the structure and the output line connection method of the pixel array illustrated in FIG. 3A.

Referring to FIG. 12, pixels PXa and PXb may respectively include three shared pixels FPXa1 to FPXa3 and FPXb1 to FPXb3 consecutively arranged in a first direction (e.g., an X-axis direction). Each of these shared pixels may include three subpixels SPX consecutively arranged in parallel in a second direction (e.g., a Y-axis direction) and sharing a floating diffusion node FD.

A plurality of column lines CL, e.g., first to sixth column lines CL1 to CL6, extending in the Y-axis direction may be arranged in parallel in the X-axis direction. Subpixels SPX arranged at the same position on the X-axis may form one column of a pixel array 10', and two columns and two column lines CL may be arranged in parallel. A pixel rod may be connected to each of the first to sixth column lines CL1 to CL6.

The first to third shared pixels FPXa1 to FPXa3 of the pixel PXa may be respectively connected to the first column line CL1, the third column line CL3, and the fifth column line CL5, and the first to third shared pixels FPXb1 to FPXb3 of the pixel PXb may be respectively connected to the second column line CL2, the fourth column line CL4, and the sixth column line CL6. The first column line CL1, the third column line CL3, and the fifth column line CL5 may be connected to a first ADC ADC1, and the second column line CL2, the fourth column line CL4, and the sixth column line CL6 may be connected to a second ADC ADC2.

When an image sensor including the pixel array 10' according to the comparative example operates in the first mode, reading may be performed in units of subpixels, and 18 pixel values corresponding to 18 subpixels SPX included in two pixels PXa and PXb may be generated by performing a read operation nine times by two ADCs (e.g., through analog-to-digital conversion by the first and second ADCs ADC1 and ADC2). When the image sensor operates in the second mode, reading may be performed in a unit of the pixel PXa or PXb. Two pixel values may be generated by performing the read operation twice by the two ADCs ADC1 and ADC2.

However, in contrast to the comparative example of FIG. 12, according to the structure and output line connection method of the pixel array 10a according to an embodiment of the inventive concept, when the image sensor 100 operates in the first mode, 27 pixel values corresponding to 27 subpixels SPX included in the three pixels PXa, PXb, and PXc may be generated by performing the read operation nine times by the three ADCs ADC1, ADC2, and ADC3. When the image sensor 100 operates in the second mode, three pixel values may be generated by performing the read operation once by the three ADCs ADC1, ADC2, and ADC3 as illustrated in FIG. 7B.

As described above, the readout efficiency of a reading method according to the structure and output line connection method according to an embodiment of the inventive concept may be greater than that of a reading method according to the structure and output line of the pixel array 10' according to the comparative example of FIG. 12. In other words, the number of reads performed to generate image data of one frame may be reduced, and thus, a frame rate of the image sensor 100 may be increased and the image sensor may operate at increased speeds compared to the comparative example.

The number (e.g., three) of output lines (e.g., column lines CL) included in the pixel array 10a according to the structure and output line connection method of the pixel array 10a according to an embodiment of the inventive concept may be less than the number (e.g., six) of output lines according to the structure and output line connection method of the pixel array 10' according to the comparative example, thereby reducing power consumption of the image sensor 100.

Figure 13A:
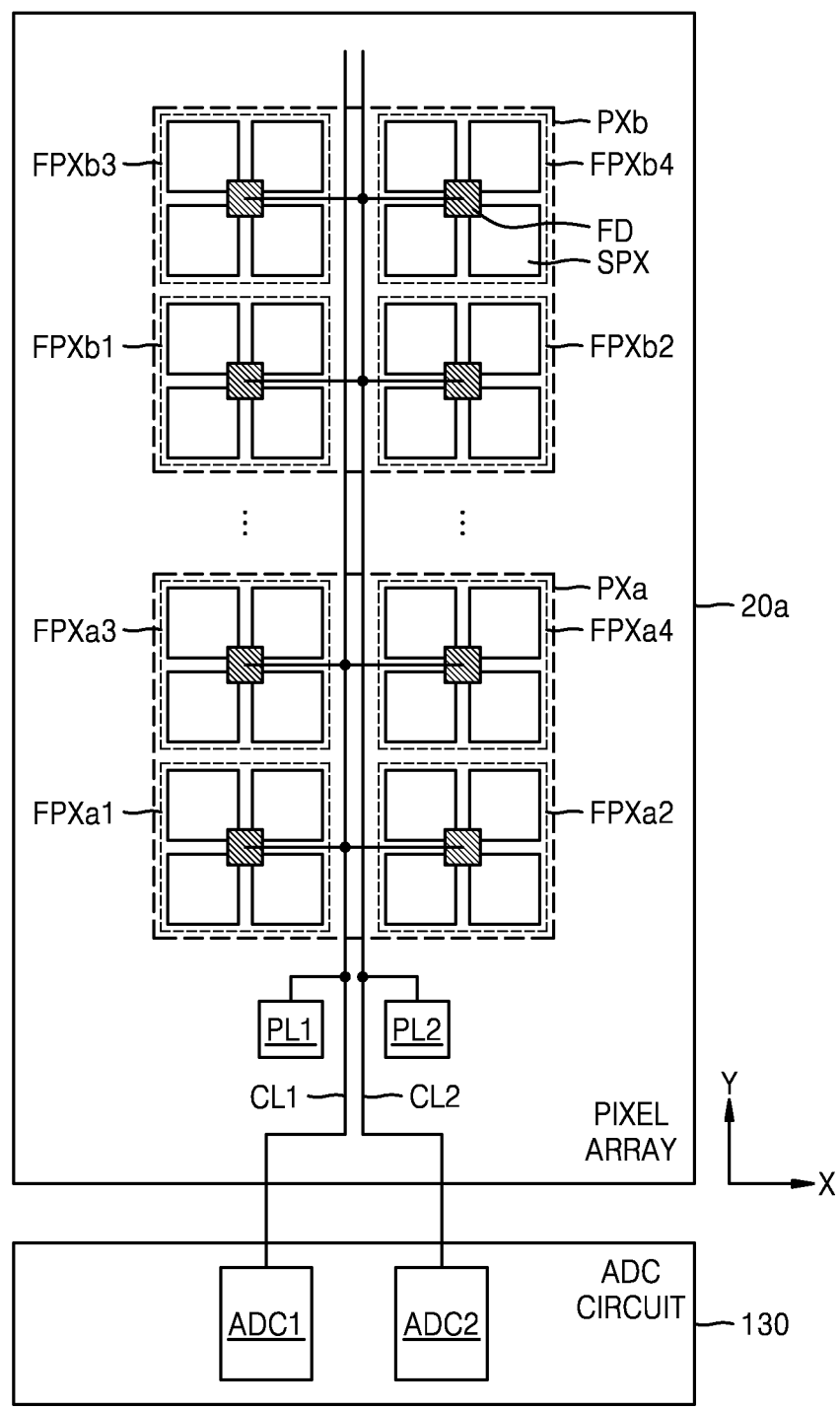
FIGS. 13A and 13B illustrate a structure and an output line connection method of a pixel array according to an embodiment of the inventive concept.
Figure 13B:
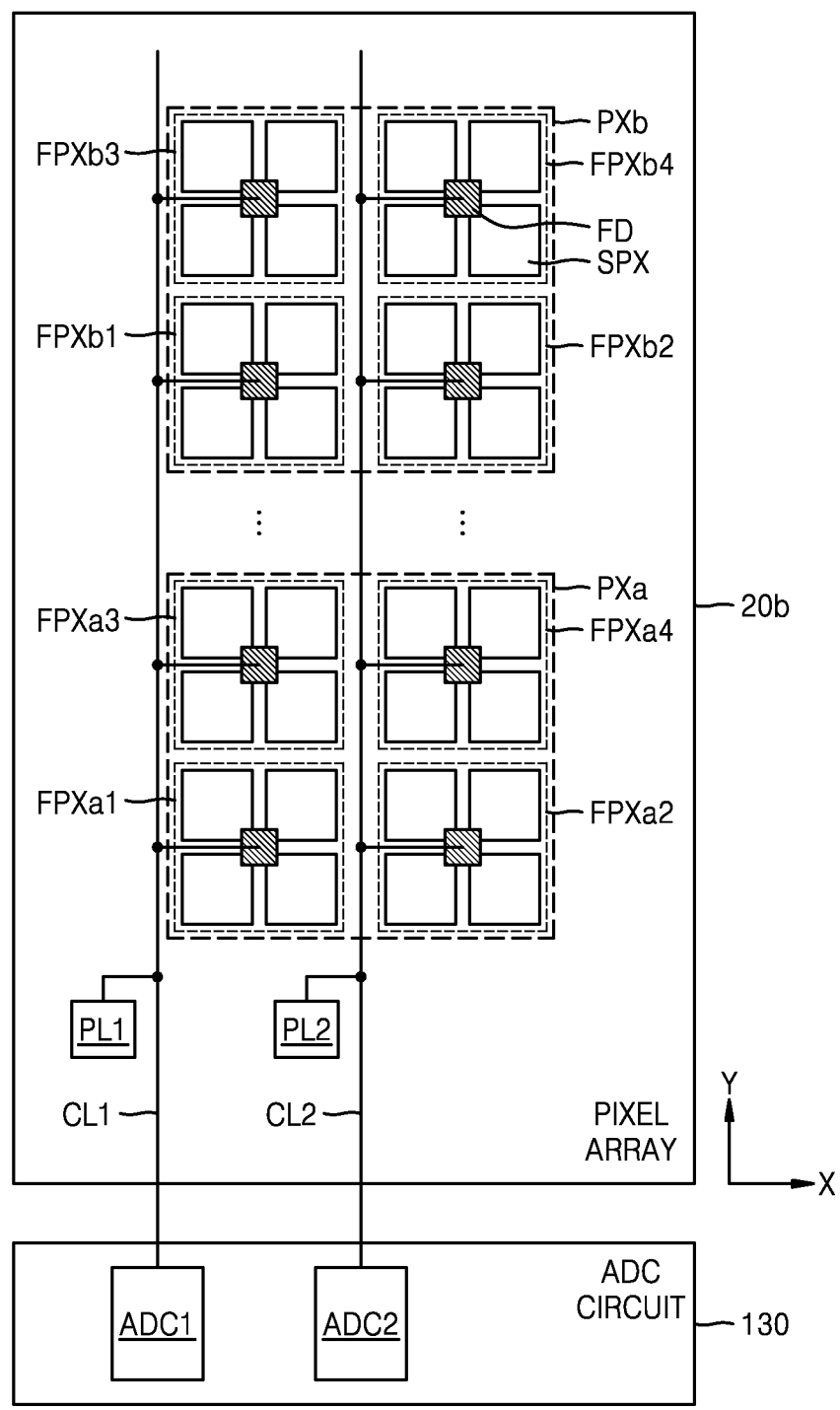

FIGS. 13A and 13B illustrate a structure and an output line connection method of a pixel array according to an embodiment of the inventive concept.

Referring to FIGS. 13A and 13B, a pixel PXa may include four shared pixels FPXa1 to FPXa4 arranged in a matrix, a pixel PXb may include four shared pixels FPXb1 to FPXb4 arranged in a matrix, and each of the shared pixels FPXa1 to FPXa4 and FPXb1 to FPXb4 may include four subpixels SPX arranged in a matrix and sharing a floating diffusion node FD.

Referring to FIG. 13A, two column lines, e.g., a first column line CL1 and a second column line CL2, may be arranged between two shared pixels (e.g., the shared pixels FPXa1 and FPXa2) consecutively arranged in parallel in a first direction (e.g., an X-axis direction). The first to fourth shared pixels FPXa1 to FPXa4 of the pixel PXa may be connected to the first column line CL1, and the first to fourth shared pixels FPXb1 to FPXb4 of the pixel PXb may be connected to the second column line CL2.

In a pixel array 20a, reading may be performed in units of subpixels when the image sensor 100 operates in the first mode or performed in units of pixels when the image sensor 100 operates in the second mode. A reading method of the pixel array 20a when the image sensor 100 operates in the first mode or the second mode is similar to the reading method described above with reference to FIGS. 6A to 7B, and thus, for convenience of explanation, a detailed description thereof is omitted.

Referring to FIG. 13B, in a pixel array 20b, two column lines, e.g., the first column line CL1 and the second column line CL2, may be arranged to correspond to two shared pixels (e.g., the shared pixels FPXa1 and FPXa2) consecutively arranged in parallel in a first direction (e.g., an X-axis direction). A plurality of shared pixels (e.g., the shared pixels FPXa1, FPXa3, FPXb1, and FPXb3) arranged at a first position on the X-axis may be connected to the first column line CL1, and a plurality of shared pixels (e.g., the shared pixels FPXa2, FPXa4, FPXb2, and FPXb4) arranged at a second position on the X-axis may be connected to the second column line CL2.

The reading method of the pixel array 20a when the image sensor 100 operates in the first mode or the second mode is similar to the reading method described above with reference to FIGS. 10A to 11B, and thus, for convenience of explanation, a detailed description thereof is omitted.

Figure 14A:
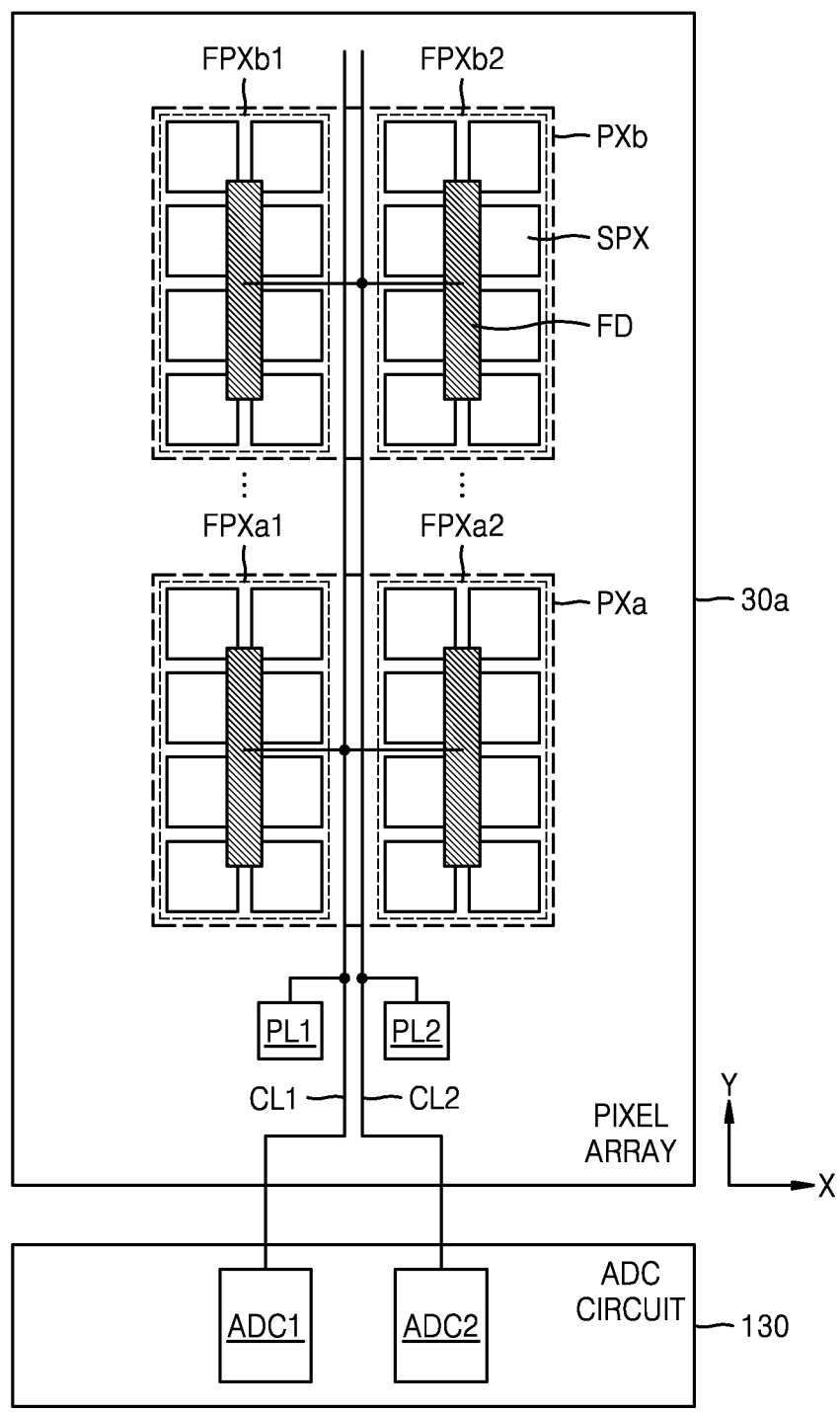
FIGS. 14A and 14B illustrate a structure and an output line connection method of a pixel array according to an embodiment of the inventive concept.
Figure 14B:
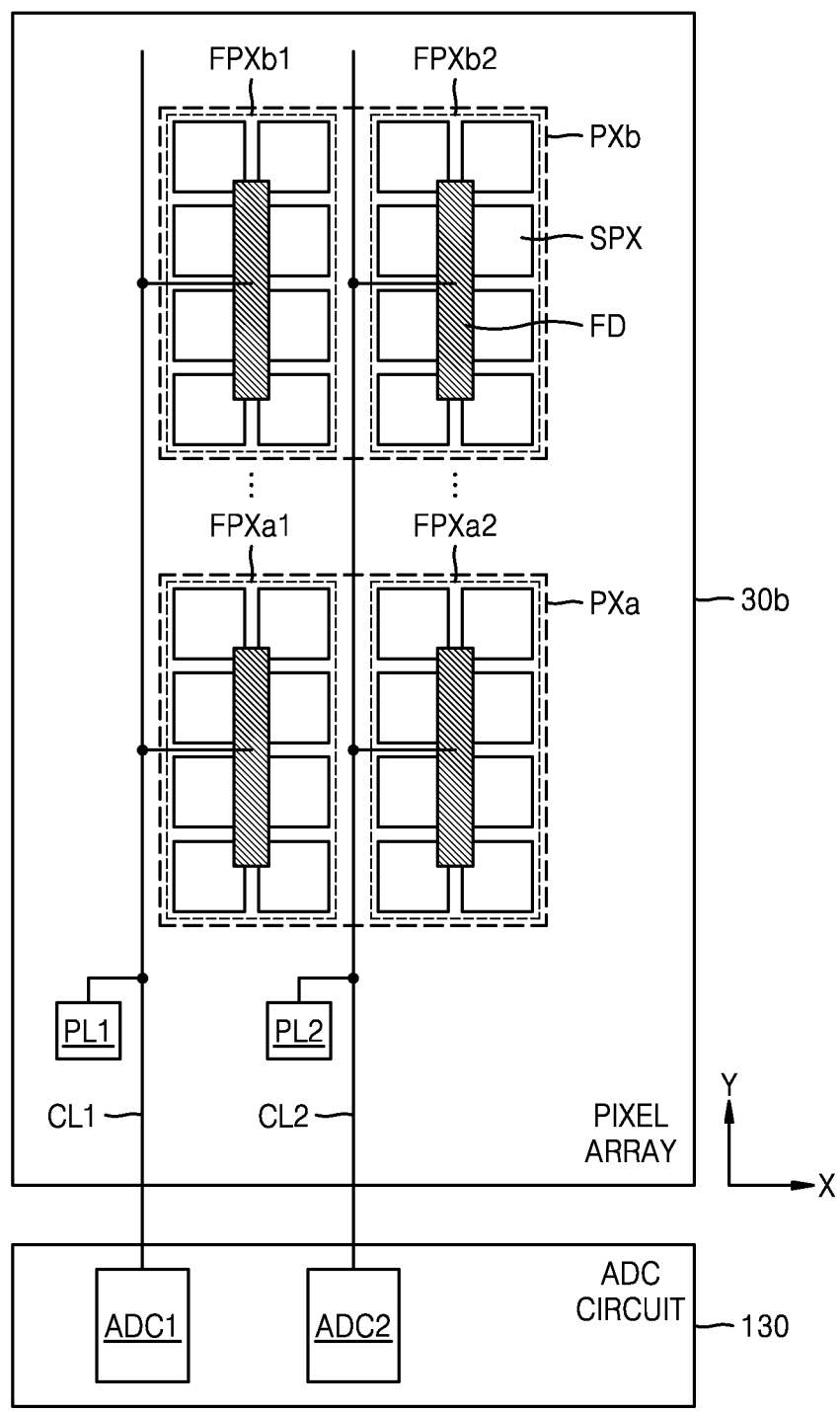

FIGS. 14A and 14B illustrate a structure and an output line connection method of a pixel array according to an embodiment of the inventive concept.

Referring to FIGS. 14A and 14B, a pixel PXa may include two shared pixels FPXa1 and FPXa2 arranged in a matrix, a pixel PXb may include two shared pixels FPXb1 and FPXb2 arranged in a matrix, and each of the shared pixels FPXa1, FPXa2, FPXb1, and FPXb2 may include eight subpixels SPX arranged in a matrix and sharing a floating diffusion node FD.

Referring to FIG. 14A, two column lines, e.g., a first column line CL1 and a second column line CL2, may be arranged between two shared pixels (e.g., the shared pixels FPXa1 and FPXa2) consecutively arranged in parallel in a first direction (e.g., an X-axis direction). The first and second shared pixels FPXa1 and FPXa2 of the pixel PXa may be connected to the first column line CL1, and the first and second shared pixels FPXb1 and FPXb2 of the pixel PXb may be connected to the second column line CL2.

In a pixel array 30a, reading may be performed in units of subpixels when the image sensor 100 operates in the first mode or performed in units of pixels when the image sensor 100 operates in the second mode. A reading method of the pixel array 30a when the image sensor 100 operates in the first mode or the second mode is similar to the reading method described above with reference to FIGS. 6A to 7B, and thus, for convenience of explanation, a detailed description thereof is omitted.

Referring to FIG. 14B, two column lines, e.g., the first column line CL1 and the second column line CL2, may be arranged to correspond to two shared pixels (e.g., the shared pixels FPXa1 and FPXa2) consecutively arranged in parallel in the first direction (e.g., the X-axis direction). The first shared pixels FPXa1 and FPXb1 of the pixels PXa and PXb may be connected to the first column line CL1, and the second shared pixels FPXa2 and FPXb2 of the pixels PXa and PXb may be connected to the second column line CL2.

The reading method of the pixel array 30a when the image sensor 100 operates in the first mode or the second mode is similar to the reading method described above with reference to FIGS. 10A to 11B, and thus, for convenience of explanation, a detailed description thereof is omitted.

Figure 15A:
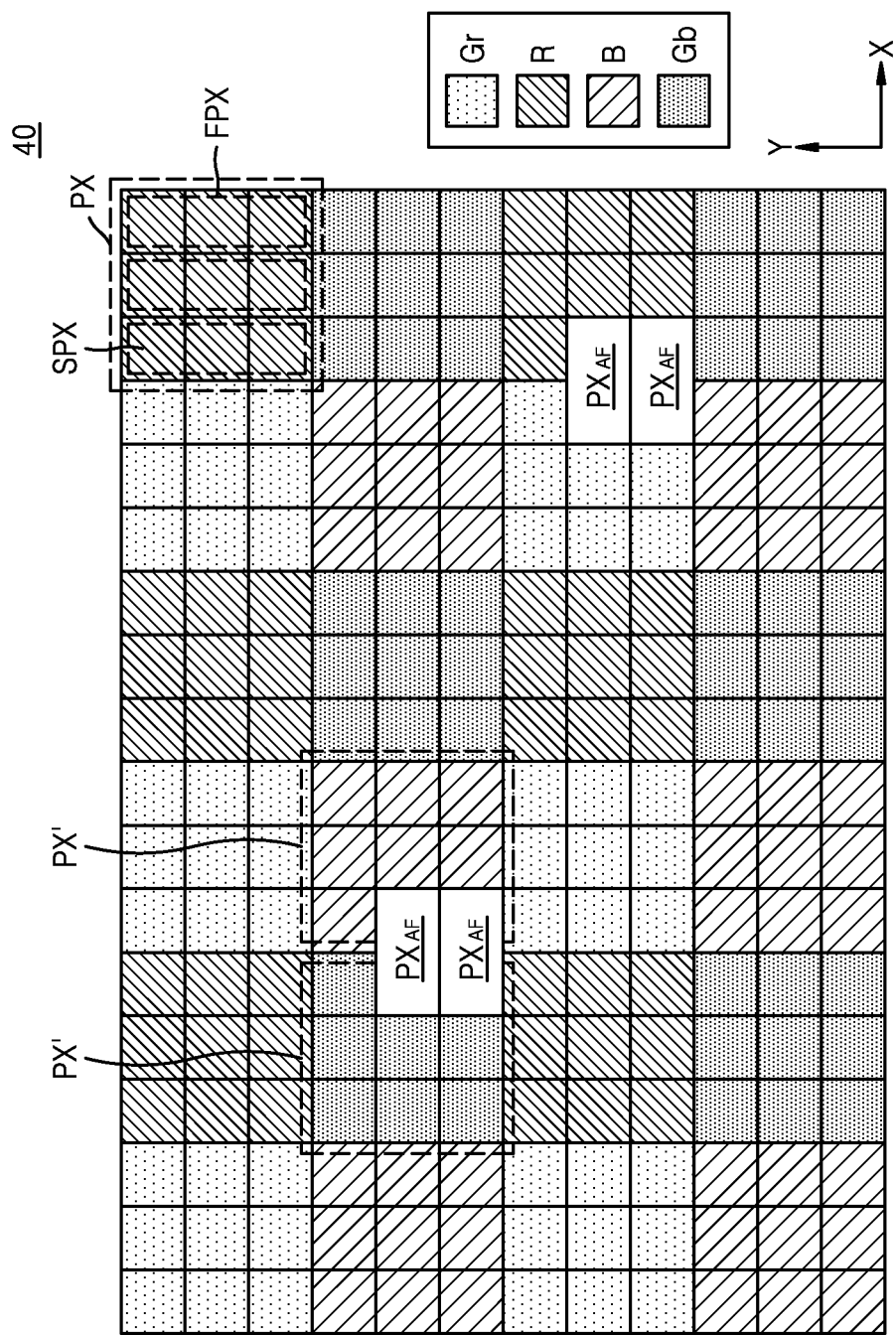
FIG. 15A illustrates an example of a pixel array included in an image sensor according to an embodiment of the inventive concept.
Figure 15B:
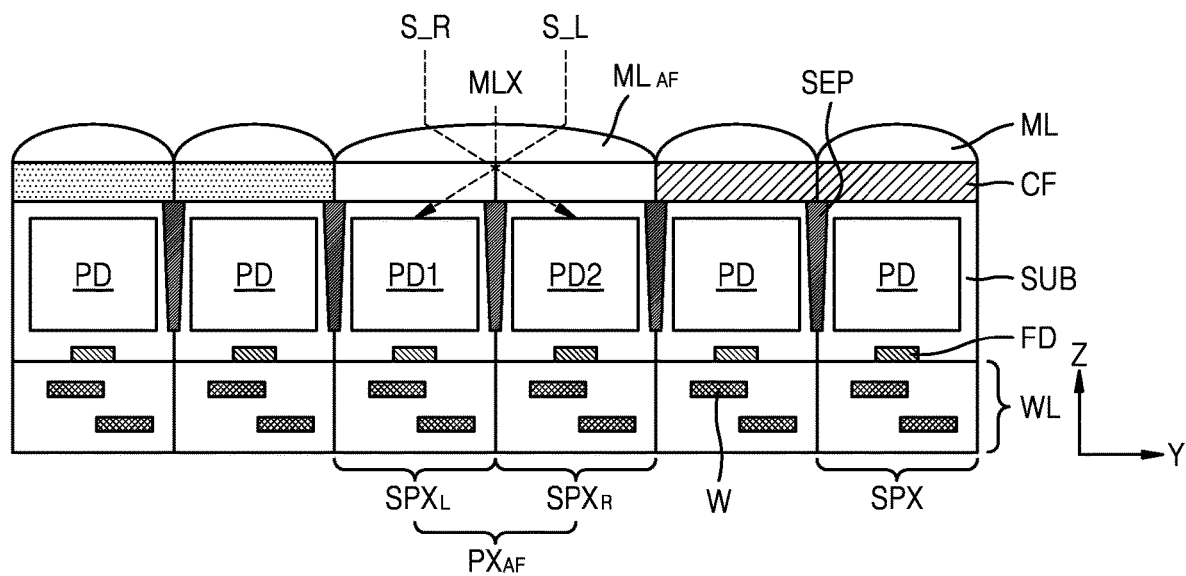
FIG. 15B is a vertical cross-sectional view of the pixel array of FIG. 15A according to an embodiment of the inventive concept.

FIG. 15A illustrates an example of a pixel array included in an image sensor according to an embodiment of the inventive concept. FIG. 15B is a vertical cross-sectional view of the pixel array of FIG. 15A according to an embodiment of the inventive concept.

A pixel array 40 of FIG. 15A may be included in the image sensor 100 of FIG. 1 and may be a modified example of the pixel array 110 of FIG. 8A described above.

Recently, an autofocus method (AF) has been employed in imaging devices to automatically detect a focus of an image sensor. Phase-difference auto focusing (PAF) technology based on phase-difference signals has been used, and the pixel array 40 may include a plurality of autofocus (AF) pixels $PX_{AF}$ to generate phase-difference signals as illustrated in FIG. 15A. Although FIG. 15A illustrates that four AF pixels $PX_{AF}$ are provided in a region of the pixel array 40 in which 24 pixels PX are arranged in a 6×4 matrix, embodiments are not limited thereto, and the number and arrangement of the AF pixels $PX_{AF}$ may vary.

Referring to FIG. 15B, the AF pixels $PX_{AF}$ may include a first sub-pixel $SPX_L$ and a second subpixel $SPX_R$. The first subpixel $SPX_L$ and the second subpixel $SPX_R$ may have a structure similar to that of a general subpixel SPX. However, one microlens $ML_{AF}$ may be provided on the first subpixel $SPX_L$ and the second subpixel $SPX_R$, and an optical axis MLX of the microlens $ML_{AF}$ may correspond to a midpoint between the first subpixel $SPX_L$ and the second subpixel $SPX_R$ in a first direction (e.g., an X-axis direction). Thus, an optical signal S_L incident on a right side of the optical axis MLX may be sensed by a photodiode PD1 of the first subpixel $SPX_L$, and an optical signal S_R incident on a left side of the optical axis MLX may be sensed by a photodiode PD2 of the second subpixel $SPX_R$. The first subpixel $SPX_L$ and the second subpixel $SPX_R$ may be read, and AF pixel values corresponding to the optical signals S_L and S_R may be generated as phase-difference signals. An imaging device may perform auto focusing based on a plurality of phase-difference signals generated in the pixel array 40.

The pixel array of FIG. 15B may further include photodiodes PD disposed in a substrate SUB, which may be similar to the substrate SUB described with reference to FIG. 5. The pixel array may further include interconnections W provided in an interconnection layer WL, which are similar to those described with reference to FIG. 5. The pixel array may further include color filters CF similar to the color filters CF1, CF2 and CF3 described with reference to FIG. 5, microlenses ML similar to the microlenses ML1, ML2 and ML3 described with reference to FIG. 5, and a plurality of SEPs similar to the plurality of SEPs described with reference to FIG. 5, and a plurality of floating diffusion regions FDs previously described.

When the image sensor 100 operates in the first mode, pixel values corresponding to a plurality of subpixels SPX, e.g., a plurality of subpixels SPX included in a plurality of pixels PX, and pixel values corresponding to first subpixels $SPX_L$ and second subpixels $SPX_R$ included in a plurality of AF pixels $PX_{AF}$, may be generated, in which the pixel values corresponding to the plurality of subpixels SPX may be generated as image data and the pixel values corresponding to the first subpixels $SPX_L$ and the second subpixels $SPX_R$ may be generated as AF data.

When the image sensor 100 operates in the second mode, pixel values corresponding to a plurality of pixels PX and pixels PX' including AF pixels $PX_{AF}$ may be read. In this case, a pixel value corresponding to a pixel PX may represent an average value of combined sensing signals according to the sum of photocharges generated by three subpixels SPX and output from three shared subpixels FPX. A pixel value corresponding to a pixel PX' including an AF pixel $PX_{AF}$ may represent a combined sensing signal according to the sum of photocharges generated by the first subpixels $SPX_L$ (or the second subpixels $SPX_R$) included in the AF pixel $PX_{AF}$. When the image sensor 100 operates in the second mode, sensing signals corresponding to photocharges generated by subpixels SPX included in the pixel PX' including the AF pixel $PX_{AF}$ may not be output.

Figure 16:
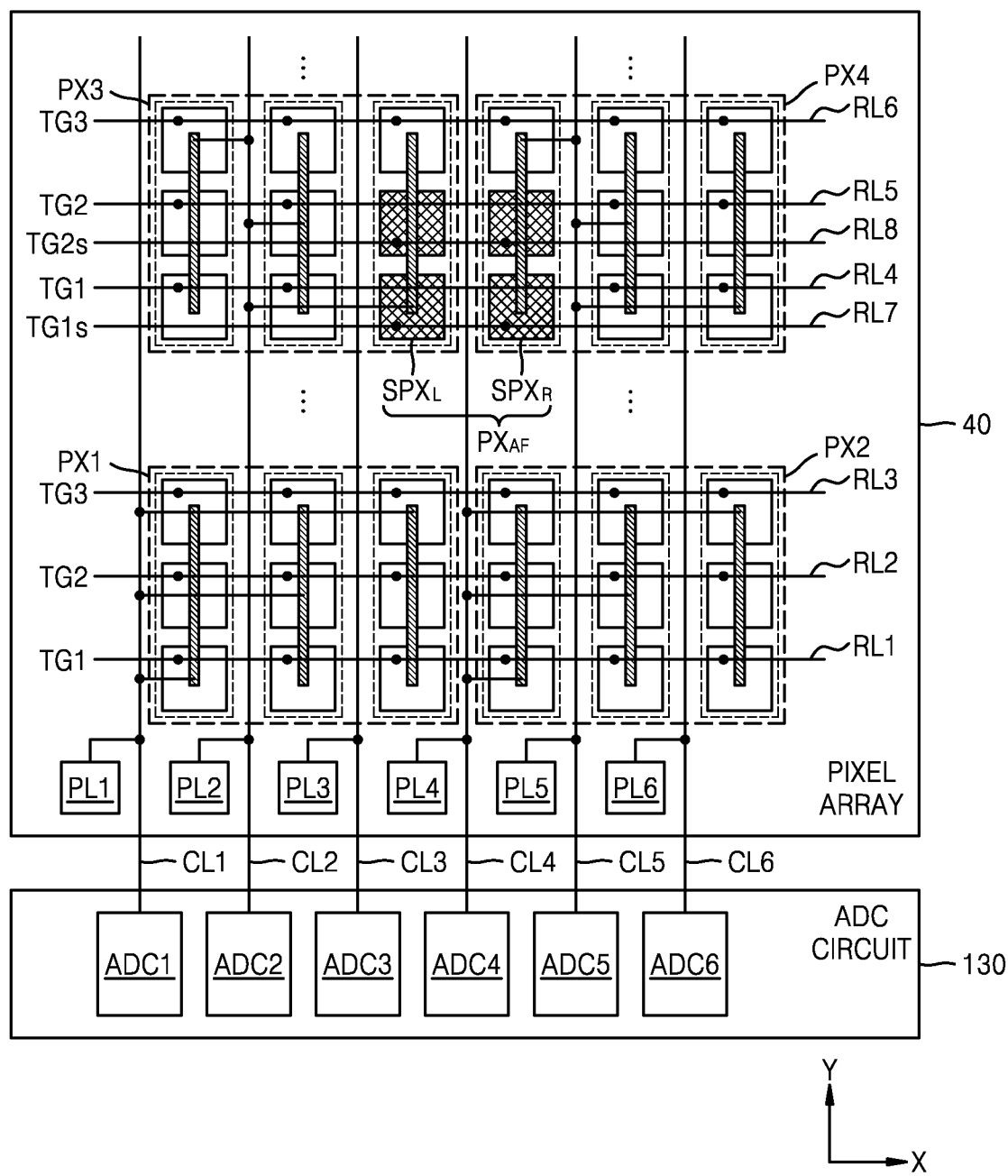
FIG. 16 illustrates an example of the pixel array of FIG. 14A according to an embodiment of the inventive concept.

FIG. 16 illustrates an example of the pixel array 30a of FIG. 14A according to an embodiment of the inventive concept.

Referring to FIG. 16, a structure and output lines of a plurality of pixels, e.g., first to fourth pixels PX1 to PX4, of a pixel array 40 may be the same as those of the pixels PXa, PXb, and PXc described above with reference to FIG. 3A. Thus, for convenience of explanation, a further description thereof will be omitted.

A plurality of control signals may be provided through a plurality of row lines RL1 to RL8. For example, first to third transmission control signals TG1, TG2 and TG3 may be provided to a plurality of subpixels SPX through the first to sixth row lines RL1 to RL6. Other transmission control signals TG1s and TG2s and/or selection signals may be provided to a first subpixel $SPX_L$ and a second subpixel $SPX_R$ included in an AF pixel $PX_{AF}$ through separate row lines, e.g., seventh and eighth row lines RL7 and RL8.

Thus, during a read operation, subpixels SPX included in general pixels, e.g., the first pixel PX1 and the second pixel PX2, and subpixels SPX and the first subpixel $SPX_L$ or the second subpixel $SPX_R$ included in pixels, e.g., the third pixel PX3 and the fourth pixel PX4, which include AF pixels $PX_{AF}$, may be independently controlled.

For example, when the image sensor 100 operates in the second mode, a first pixel value and a second pixel value may be respectively generated for the first pixel PX1 and the second pixel PX2, and used as image data. In addition, a third pixel value and a fourth pixel value corresponding to the first subpixel $SPX_L$ and the second subpixel $SPX_R$ included in the AF pixel $PX_{AF}$ may be respectively generated with respect to the third pixel PX3 and the fourth pixel PX4. The third pixel value corresponds to the sum of photocharges generated in the first subpixel $SPX_L$, and in this case, the amount of photocharges generated in general subpixels SPX included in the third pixel PX3 is not reflected in the third pixel value. Likewise, the third pixel value corresponds to the sum of photocharges generated in the second subpixel $SPX_R$, and in this case, the amount of photocharges generated in general subpixels SPX included in the fourth pixel PX4 is not reflected in the fourth pixel value. The third pixel value and the fourth pixel value may be used as a binocular parallax signal.

The ADC circuit 130 connected to the pixel array of FIG. 16 may include first to sixth ADCs ADC1 to ADC6, which are respectively connected to first to sixth column lines CL1 to CL6, which are respectively connected to first to sixth pixel loads PL1 to PL6.

Figure 17A:
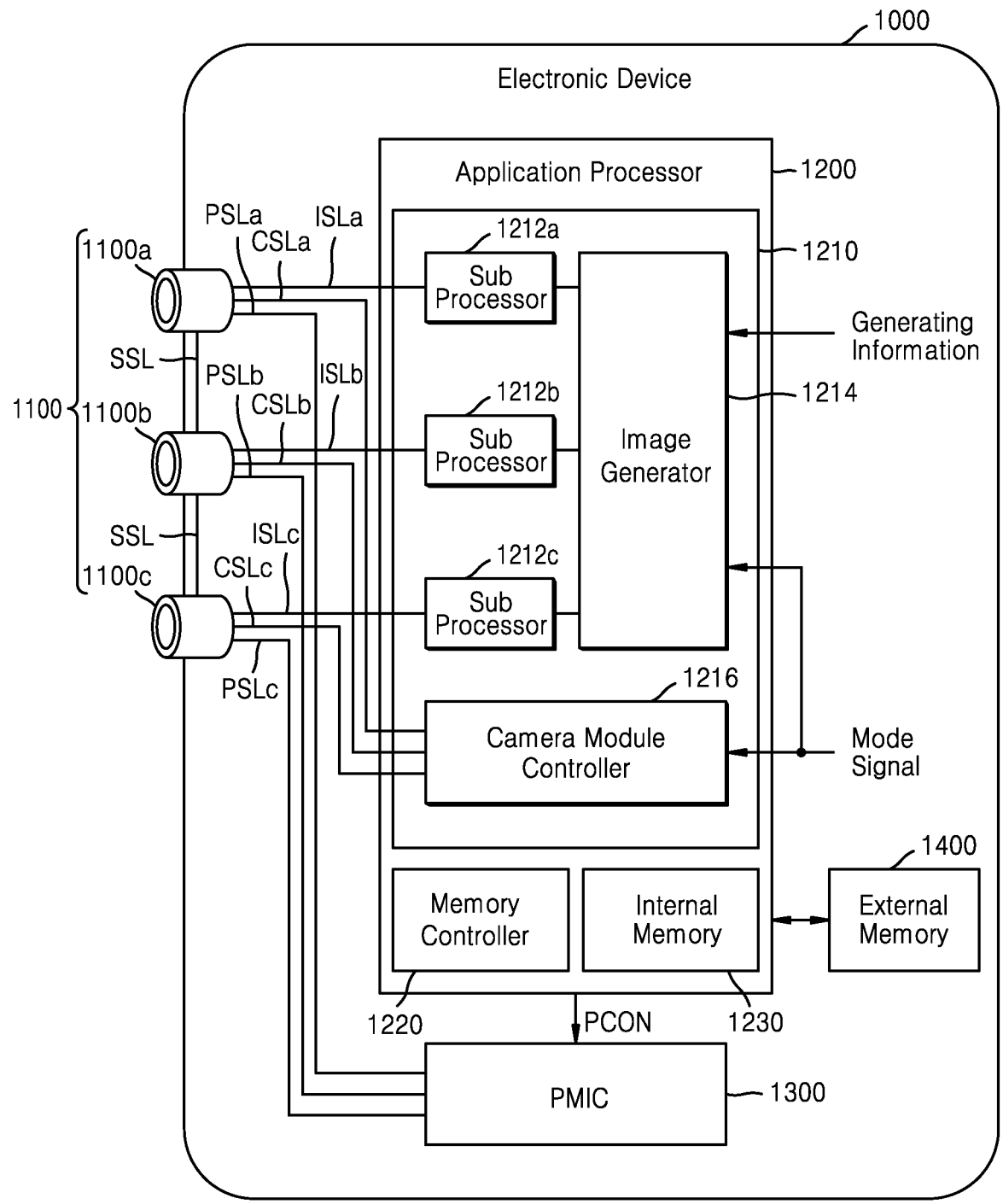
FIGS. 17A and 17B are block diagrams of examples of an electronic device including a multi-camera module according to an embodiment of the inventive concept.
Figure 17B:
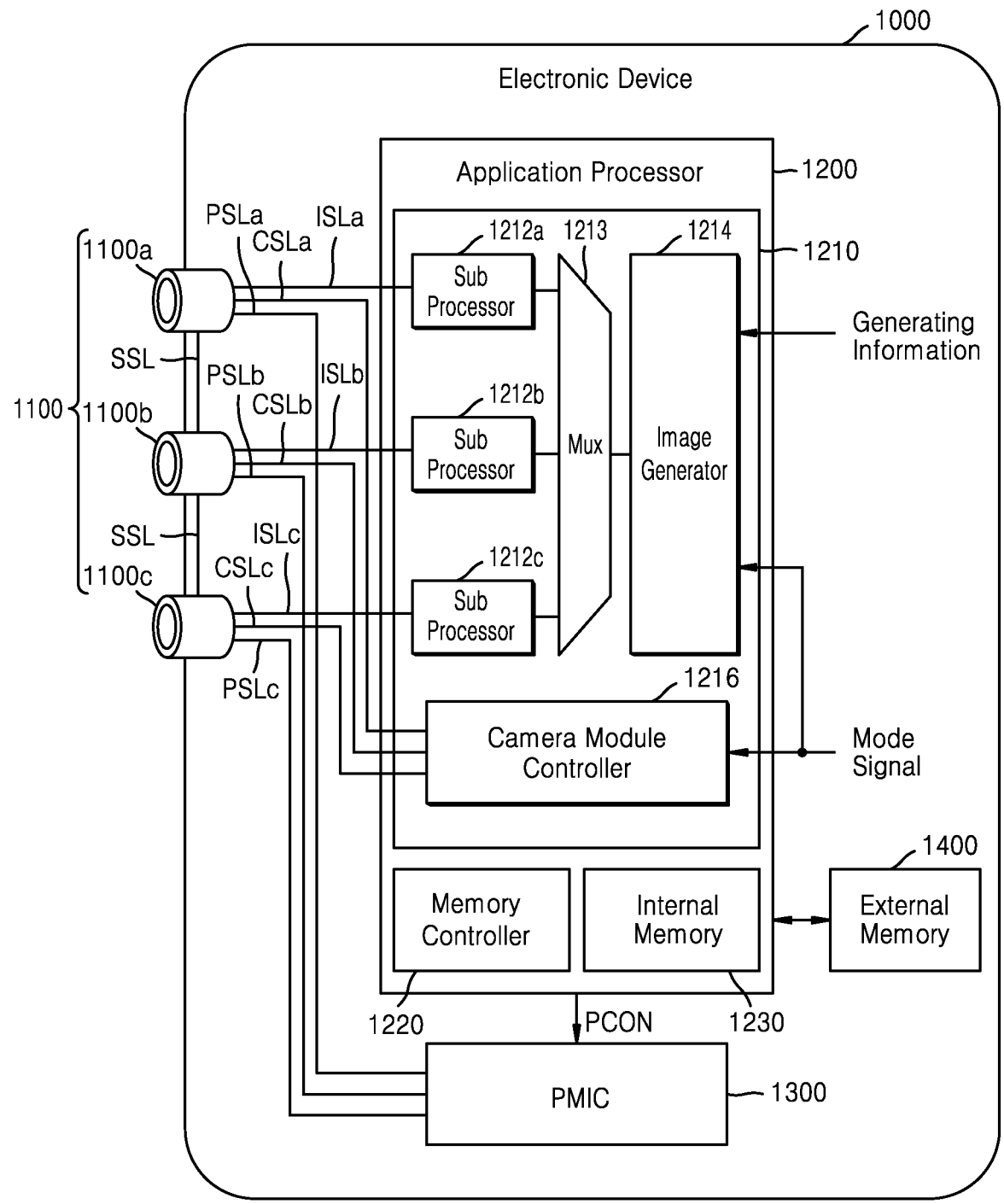
Figure 18:
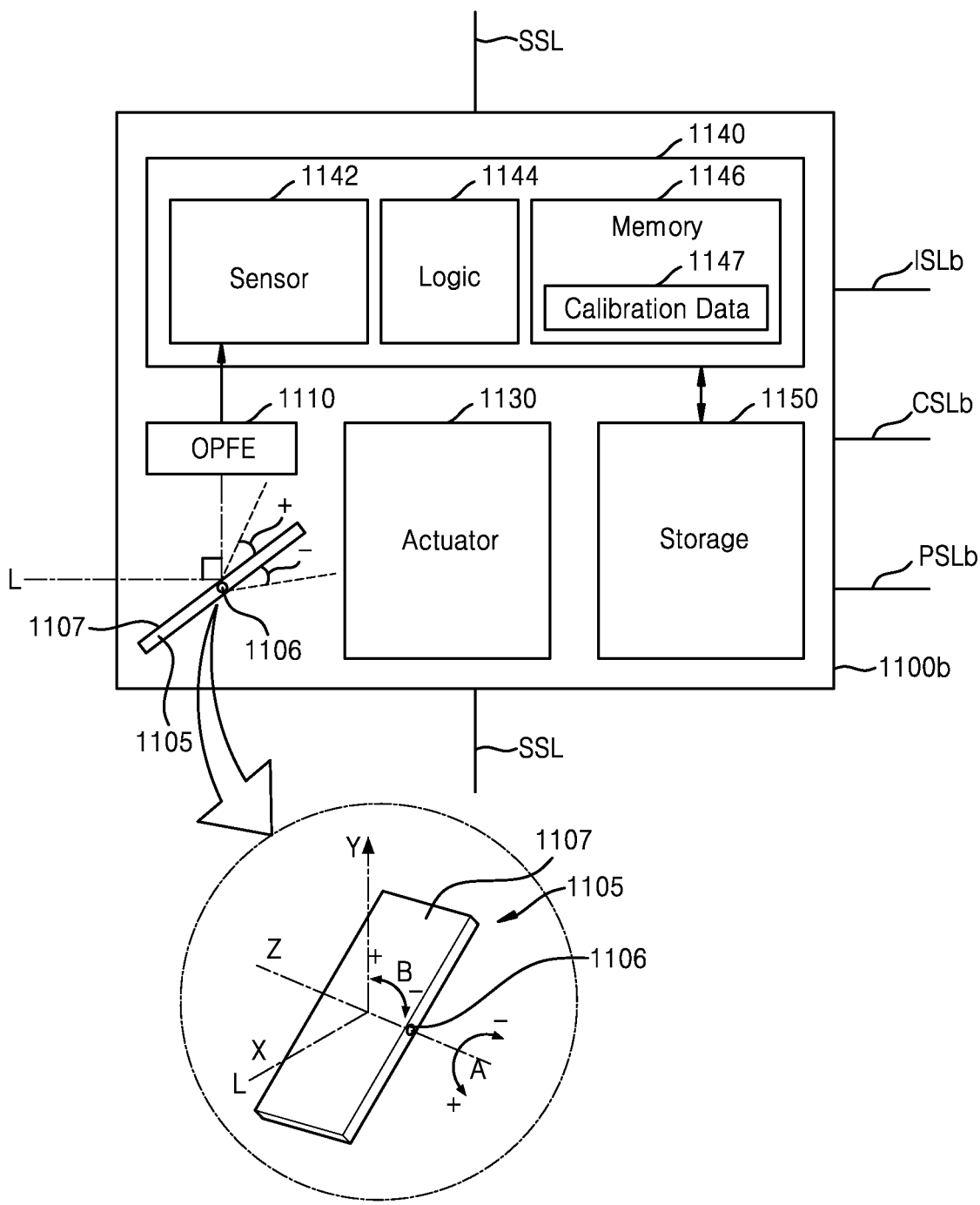
FIG. 18 is a detailed block diagram of the camera module of FIGS. 17A and 17B according to an embodiment of the inventive concept.

FIGS. 17A and 17B are block diagrams of examples of an electronic device including a multi-camera module according to an embodiment of the inventive concept. FIG. 18 is a detailed block diagram of the camera module of FIGS. 17A and 17B according to an embodiment of the inventive concept.

Referring to FIGS. 17A and 17B, an electronic device 1000 may include a camera module group 1100, an application processor 1200, a power management integrated circuit (PMIC) 1300, and an external memory 1400.

The camera module group 1100 may include a plurality of cameras modules 1100a, 1100b, and 1100c. Although an embodiment in which three camera modules 1100a, 1100b, and 1100c are arranged is illustrated, embodiments are not limited thereto. For example, in some embodiments, the camera module group 1100 may include only two camera modules or N camera modules (in which N is a natural number greater than 3).

Although a configuration of the camera module 1100b will be described in more detail with reference to FIG. 18 below, the following description may also apply to the other camera modules 1100a and 1100b in embodiments of the inventive concept.

Referring to FIG. 18, the camera module 1100b may include a prism 1105, an optical path folding element (OPFE) 1110, an actuator 1130, an image sensing device 1140, and a storage 1150.

The prism 1105 may change a path of light L incident from outside the camera module 1100b, including a reflective surface 1107 of a light reflective material.

In some embodiments, the prism 1105 may change a path of light incident in a first direction X to a second direction Y perpendicular to the first direction X. In addition, the prism 1105 may rotate the reflective surface 1107 of the light reflective material about a central axis 1106 in a direction A or rotate the central axis 1106 in a direction B so as to change a path of light L incident in the first direction X to the second direction Y perpendicular to the first direction X. In this case, the OPFE 1110 may be moved in the first direction X and a third direction Z perpendicular to the second direction Y.

In some embodiments, as illustrated in FIG. 18, a maximum angle of rotation of the prism 1105 may be about 15 degrees or less in a positive (+) direction A and may be greater than about 15 degrees in a negative (−) direction A. However, embodiments of the inventive concept are not limited thereto.

In some embodiments, the prism 1105 may be moved within a range of about 20 degrees or less, a range of about 10 degrees to about 20 degrees, or a range of about 15 degrees to about 20 degrees in the positive (+) or negative (−) direction B. The prism 1105 may be moved by the same angle or substantially the same angles within an error range of about 1 degree or less in the positive (+) or negative (−) direction B.

In some embodiments, the prism 1105 may move the reflective surface 1107 of the light reflective material in the third direction Z (e.g., a Z-axis direction) parallel to a direction in which the central axis 1106 extends.

In some embodiments, the camera module 1100b may include two or more prisms, and thus, a path of light L incident in the first direction X may be changed variously, e.g., to the second direction Y perpendicular to the first direction X, to the first direction X or the third direction Z, and to the second direction Y.

The OPFE 1110 may include, for example, m groups of optical lenses (in which m is natural number). The m groups of lenses may be moved in the second direction Y to change an optical zoom ratio of the camera module 1100b. For example, when a basic optical zoom ratio of the camera module 1100b is Z, the optical zoom ratio of the camera module 1100b may be changed to 3Z, 5Z, or more than 5Z when the m groups of optical lenses of the OPFE 1110 are moved.

The actuator 1130 may move the OPFE 1110 or an optical lens (each of which may hereinafter be referred to as an optical lens) to a certain position. For example, for accurate sensing, the actuator 1130 may adjust a position of the optical lens such that an image sensor 1142 is located at a focal length of the optical lens.

The image sensing device 1140 may include the image sensor 1142, a control logic 1144, and a memory 1146. The image sensor 1142 may sense an image of an object to be sensed by using light L provided through the optical lens. The pixel array 110 of FIG. 1, 10 of FIG. 2A, 20 of FIG. 2B, 10a of FIG. 3A, 10b of FIG. 3B, 10c of FIG. 9, 20a of FIG. 13A, 20b of FIG. 13B, 30a of FIG. 14A, 30b of FIG. 14B, or 40 of FIG. 15A of the image sensor 100 of FIG. 1 described above with reference to FIGS. 1 to 11B and 13A to 16 may be applied as the image sensor 1142. By reducing the number of output lines, e.g., column lines CL, of the image sensor 1142, power consumption of the image sensor 114 may be reduced, and readout performance thereof may be increased, thus increasing a frame rate of the image sensor 1142.

The control logic 1144 may control overall operations of the camera module 1100b and process a sensed image. For example, the control logic 1144 may control an operation of the camera module 1100b according to a control signal provided through a control signal line CSLb, and extract image data corresponding to a certain image of, for example, faces, arms, or legs of people, from the sensed image.

In some embodiments, the control logic 1144 may perform image processing such as, for example, encoding and noise reduction, on the sensed image.

The memory 1146 may store information such as, for example, calibration data 1147, utilized for an operation of the camera module 1100b. The calibration data 1147 is information utilized for the camera module 1100b to generate image data by using light L from outside the camera module 1100b, and may include, for example, information regarding a degree of rotation, information regarding a focal length, information regarding an optical axis, etc. When the camera module 1100b is in the form of a multi-state camera in which a focal distance varies depending on a position of the optical lens, the calibration data 1147 may include a focal distance value of each position (or each state) of the optical lens and information related to auto focusing.

The storage 1150 may store image data sensed through the image sensor 1142. The storage 1150 may be disposed outside the image sensing device 1140 and may be stacked on a sensor chip of the image sensing device 1140. In some embodiments, the image sensor 1142 may be configured as a first chip, the control logic 1144, the storage 1150 and the memory 1146 may be configured together as a second chip, and the two chips may be stacked.

In some embodiments, the storage 1150 may be embodied as an electrically erasable programmable read-only memory (EEPROM). However, embodiments of the inventive concept are not limited thereto. For example, in some embodiments, the image sensor 1142 may include a pixel array, and the control logic 1144 may include an analog-to-digital converter and an image signal processor for processing a sensed image.

Referring to FIGS. 17A and 18 together, in some embodiments, each of the plurality of cameras modules 1100a, 1100b, and 1100c may include the actuator 1130. Accordingly, each of the plurality of cameras modules 1100a, 1100b, and 1100c may include the same or different calibration data 1147 according to an operation of the actuator 1130 therein.

In some embodiments, a camera module (e.g., the camera module 1100b) among the plurality of cameras modules 1100a, 1100b, and 1100c may be a folded lens type camera module that includes the prism 1105 and the OPFE 1110, and the other camera modules (e.g., the camera modules 1100a and 1100c) may be vertical camera modules that do not include the prism 1105 and the OPFE 1110. However, embodiments of the inventive concept are not limited thereto.

In some embodiments, a camera module (e.g., the camera module 1100c) among the plurality of cameras modules 1100a, 1100b, and 1100c may be, for example, a vertical depth camera that extracts depth information by using infrared (IR) rays. In this case, the application processor 1200 may merge image data provided from the depth camera and image data provided from another camera module (e.g., the camera module 1100a or 1100b) to generate three-dimensional (3D) depth image data.

In some embodiments, at least two camera modules (e.g., the camera modules 1100a, 1100b) among the plurality of cameras modules 1100a, 1100b, and 1100c may have different fields of view (viewing angles). In this case, for example, at least two camera modules (e.g., the camera modules 1100a and 1100b) among the plurality of camera modules 1100a, 1100b and 1100c may include different optical lenses. However, embodiments of the inventive concept are not limited thereto.

In some embodiments, viewing angles of the plurality of cameras modules 1100a, 1100b, and 1100c may be different. For example, the camera module 1100a may be an ultra-wide camera, the camera module 1100b may be a wide camera, and the camera module 1100c may be a tele camera. However, embodiments of the inventive concept are not limited thereto. In this case, optical lenses included in the plurality of cameras modules 1100a, 1100b, and 1100c may be different. However, embodiments of the inventive concept are not limited thereto.

In some embodiments, the plurality of cameras modules 1100a, 1100b, and 1100c may be physically separated from one another. That is, a sensing region of one image sensor 1142 is not divided and used by the plurality of camera modules 1100a, 1100b and 1100c, but the image sensor 1142 may be independently provided in each of the plurality of cameras modules 1100a, 1100b, and 1100c.

Referring back to FIGS. 17A and 17B, the application processor 1200 may include an image processing device 1210, a memory controller 1220, and an internal memory 1230. The application processor 1200 may be, for example, a semiconductor chip provided separately from the plurality of cameras modules 1100a, 1100b, and 1100c.

The image processing device 1210 may include a plurality of sub-image processors 1212a, 1212b, and 1212c, an image generator 1214, and a camera module controller 1216.

The image processing device 1210 may include the plurality of sub-image processors 1212a, 1212b, and 1212c, the total number of which is equal to the number of the plurality of cameras modules 1100a, 1100b, and 1100c.

Image data generated by the camera module 1100a may be provided to the sub-image processor 1212a through the image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. The image data may be transmitted, for example, using a camera serial interface (CSI) based on a mobile industry processor interface (MIPI). However, embodiments of the inventive concept are not limited thereto.

In some embodiments, one sub-image processor may correspond to a plurality of camera modules. For example, in an embodiment, the sub-image processor 1212a and the sub-image processor 1212b are not implemented separately, unlike that illustrated in FIGS. 17A and 17B, but rather, may be integrated together as one sub-image processor, and image data provided from the camera module 1100a and the camera module 1100c may be selected by a selector (e.g., a multiplexer) or the like and provided to the integrated sub-image processor. In this case, in an embodiment, the sub-image processor 1212b is not integrated and may receive image data from the camera module 1100b.

In some embodiments, image data generated by the camera module 1100a may be provided to the sub-image processor 1212a through the image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. Image data processed by the sub-image processor 1212b may be directly provided to the image generator 1214, but image data processed by the sub-image processor 1212a or image data processed by the sub-image processor 1212c may be selected by a selector (e.g., a multiplexer) and provided to the image generator 1214.

The sub-image processors 1212a, 1212b, and 1212c may perform image processing such as, for example, bad pixel correction, 3A control (auto-focus correction, auto-white balance, and auto-exposure), noise reduction, sharpening, gamma control, or remosaicing, on image data provided from the camera modules 1100a, 1100b, and 1100c.

In some embodiments, remosaic signal processing may be performed by the cameras modules 1100a, 1100b, and 1100c, and results thereof may be provided to the sub-image processors 1212a, 1212b, and 1212c.

Image data processed by each of the sub-image processor 1212a, 1212b, and 1212c may be provided to the image generator 1214. The image generator 1214 may generate an output image by using image data provided from each of the sub-image processors 1212a, 1212b, and 1212c according to image generating information or a mode signal.

For example, the image generator 1214 may generate an output image by merging at least a part of the image data generated by the image processors 1212a, 1212b, and 1212c according to the image generating information or the mode signal. Alternatively, the image generator 1214 may generate an output image by selecting one of the image data generated by the image processor 1212a, the image data generated by the image processor 1212b, and the image data generated by the image processor 1212c according to the image generating information or the mode signal.

In some embodiments, the image generating information may include a zoom signal or a zoom factor. In some embodiments, the mode signal may be, for example, a signal based on a mode selected by a user.

When the image generating information is a zoom signal (or a zoom factor) and the camera modules 1100a, 1100b, and 1100c have different fields of view (viewing angles), the image generator 1214 may perform a different operation according to a type of the zoom signal. For example, when the zoom signal is a first signal, an output image may be generated using the image data output from the sub-image processor 1212a among the image data output from the sub-image processor 1212a and the image data output from the sub-image processor 1212c and the image data output from the sub-image processor 1212b. When the zoom signal is a second signal different from the first signal, the image generator 1214 may generate an output image by using the image data output from the sub-image processor 1212c among the image data output from the sub-image processor 1212a and the image data output from the sub-image processor 1212c and the image data output from the sub-image processor 1212b. When the zoom signal is a third signal different from the first and second signals, the image generator 1214 may generate an output signal by selecting the image data output from the sub-image processor 1212a, the image data output from the sub-image processor 1212b, or the image data output from the sub-image processor 1212c without merging image data. However, embodiments are not limited thereto, and modifications may be made in the above methods of processing image data according to embodiments of the inventive concept.

Referring to FIG. 17B, in some embodiments, the image processing device 1210 may further include a selector 1213 (e.g., a multiplexer) to select an output of the sub-image processor 1212a, 1212b, or 1212c and transmit the output to the image generator 1214.

In this case, the selector 1213 may perform a different operation according to the zoom signal or the zoom factor. For example, when the zoom signal is a fourth signal (indicating, for example, that a zoom ratio is a first zoom ratio), the selector 1213 may select an output of the sub-image processor 1212a, 1212b, or 1212c and transmit the output to the image generator 1214.

When the zoom signal is a fifth signal (indicating, for example, that a zoom ratio is a second zoom ratio) different from the fourth signal, the selector 1213 may sequentially transmit p outputs of the image processors 1212a, 1211b and 1212c to the image generator 1214 (in which p is a natural number greater than or equal to 2). For example, the selector 1213 may sequentially transmit an output of the sub-image processor 1212b and an output of the sub-image processor 1212c to the image generator 1214. Alternatively, the selector 1213 may sequentially transmit the output of the sub-image processor 1212a and an output of the sub-image processor 1212b to the image generator 1214. The image generator 1214 may merge the sequentially transmitted p outputs to generate an output image.

Here, image processing such as, for example, demosaicing, downscaling to a video/preview resolution size, gamma correction, and highly dynamic range (HDR) processing, may be performed on the image data in advance by the sub-image processors 1212a, 1212b and 1212c, and resultant image data is transmitted to the image generator 1214. Therefore, even when the resultant image data is provided to the image generator 1214 by the selector 1213 through one signal line, an image merging operation of the image generator 1214 may be performed at a high speed.

In some embodiments, the image generator 1214 may receive a plurality of pieces of image data of different exposure times from at least one of the plurality of sub-image processors 1212a, 1212b, 1212c, and perform HDR processing on the plurality of pieces of image data to generate merged image data having an increased dynamic range.

The camera module controller 1216 may provide a control signal to the cameras modules 1100a, 1100b, and 1100c. The control signal generated by the camera module controller 1216 may be provided to the camera modules 1100a, 1100b, and 1100c through control signal lines CSLa, CSLb, and CSLc, which are separated from one another, respectively.

A camera module (e.g., the camera module 1100b) among the camera modules 1100a, 1100b, and 1100c may be designated as a master camera and the other camera modules (e.g., the camera modules 1100a and 1100c) may be designated as slave cameras according to image generating information, including, for example, a zoom signal or a mode signal. Such information may be included in the control signal and provided to the camera modules 1100a, 1100b, and 1100c through the control signal lines CSLa, CSLb, and CSLc, which are separated from one another, respectively.

According to a zoom factor or an operating mode signal, a camera module may be changed to operate as a master or a slave. For example, when a viewing angle of the camera module 1100a is wider than that of the camera module 1100b and the zoom factor represents a low zoom ratio, the camera module 1100a may operate as a master and the camera module 1100b may operate as a slave. Conversely, when the zoom factor represents a high zoom ratio, the camera module 1100b may operate as a master and the camera module 1100a may operate as a slave.

In some embodiments, the control signal provided from the camera module controller 1216 to the camera modules 1100a, 1100b, and 1100c may include a synchronization enable signal. For example, when the camera module 1100b is a master camera and the camera modules 1100a and 1100c are slave cameras, the camera module controller 1216 may transmit the synchronization enable signal to the camera module 1100b. The camera module 1100b receiving the synchronization enable signal may generate a synchronization signal, based on the synchronization enable signal, and provide the synchronization signal to the camera modules 1100a and 1100c through a synchronization signal line SSL. The camera module 1100b and the camera modules 1100a and 1100c may transmit image data to the application processor 1200 in synchronization with the synchronization signal.

In some embodiments, the control signal provided from the camera module controller 1216 to the camera modules 1100a, 1100b, and 1100c may include mode information according to the mode signal. Based on the mode information, the camera modules 1100a, 1100b, and 1100c may operate in a first operating mode or a second operating mode in relation to a sensing speed.

In the first operating mode, the camera modules 1100a, 1100b, and 1100c may generate an image signal at a first speed (e.g., generate an image signal at a first frame rate), encode the image signal at a second speed higher than the first speed (e.g., encode the image signal at a second frame rate higher than the first frame rate), and transmit the encoded image signal to the application processor 1200. In this case, the second speed may be about 30 times less than the first speed.

The application processor 1200 may store the received image signal, that is, the encoded image signal, in the internal memory 1230 therein or the external memory 1400 disposed outside the application processor 1200, read the encoded image signal from the internal memory 1230 or the storage 1400, decode the read image signal, and display image data generated based on the decoded image signal. For example, a corresponding sub-image processor among the plurality of sub-image processors 1212a, 1212b, and 1212c of the image processing device 1210 may decode the read image signal and perform image processing on the decoded image signal.

In the second operating mode, the camera modules 1100a, 1100b, and 1100c may generate an image signal at a third speed lower than the first speed (e.g., generate an image signal of a third frame rate lower than the first frame rate), and transmit the image signal to the application processor 1200. The image signal provided to the application processor 1200 may be an uncoded signal. The application processor 1200 may perform image processing on the received image signal or store the image signal in the internal memory 1230 or the external memory 1400.

The PMIC 1300 may supply power, e.g., a power supply voltage, to the camera modules 1100a, 1100b, and 1100c. For example, the PMIC 1300 may supply first power to the camera module 1100a through a power signal line PSLa, supply second power to the camera module 1100b through a power signal line PSLb, and supply third power to the camera module 1100c through a power signal line PSLc, under control of the application processor 1200.

The PMIC 1300 may generate power corresponding to each of the camera modules 1100a, 1100b, and 1100c and adjust a power level, in response to a power control signal PCON from the application processor 1200. The power control signal PCON may include a power adjustment signal corresponding to an operating mode of each of the camera modules 1100a, 1100b, and 1100c. For example, the operating mode may include a low power mode, and in this case, the power control signal PCON may include information regarding a camera module operating at the lower power mode and a set power level. Levels of the power provided to the cameras modules 1100a, 1100b, and 1100c may be the same or different from one another. In addition, the levels of power may be dynamically changed.

While the inventive concept has been particularly shown and described with reference to the embodiments thereof, it will be understood that various changes in form and detail may be made therein without departing from the spirit and scope of the inventive concept as defined by the following claims.

What is claimed is:

1. An image sensor, comprising:
a pixel array, comprising:
a plurality of shared pixels arranged in a first direction and a second direction, each of the plurality of shared pixels comprising a plurality of subpixels connected to a same floating diffusion node; and
a plurality of column lines connected to the plurality of shared pixels, extending in the second direction, and arranged in parallel in the first direction; and
an analog-to-digital conversion circuit comprising a plurality of analog-to-digital converters (ADCs) connected to the plurality of column lines,
wherein each of the plurality of ADCs converts a sensing signal received from a corresponding column line among the plurality of column lines into a pixel value,
wherein at least two first shared pixels, among the plurality of shared pixels, consecutively arranged in parallel in at least one of the first and second directions are configured to sense a first optical signal of a first color and the at least two first shared pixels are connected to a first column line among the plurality of column lines.

2. The image sensor of claim 1, wherein the plurality of subpixels comprises N subpixels consecutively arranged in parallel in the second direction, wherein N is an integer greater than or equal to 3, and
the at least two first shared pixels connected to the first column line comprise N first shared pixels consecutively arranged in parallel in the first direction.

3. The image sensor of claim 1, wherein a column line among the plurality of column lines is provided between two subpixels consecutively arranged in parallel in the first direction among the plurality of subpixels.

4. The image sensor of claim 1, wherein the plurality of subpixels comprises N subpixels consecutively arranged in parallel in the first direction, wherein N is an integer greater than or equal to 3, and
the at least two first shared pixels connected to the first column line comprise N first shared pixels consecutively arranged in parallel in the second direction.

5. The image sensor of claim 1, wherein each of the plurality of subpixels comprises a photoelectric conversion element, a color filter, and a microlens.

6. The image sensor of claim 5, wherein the plurality of subpixels comprises three subpixels consecutively arranged in parallel in the first direction or the second direction, and
the at least two first shared pixels connected to the first column line comprise three first shared pixels consecutively arranged in parallel in the second direction or the first direction,
wherein each of nine subpixels included in the three first shared pixels comprises a first color filter that transmits a second optical signal of the first color.

7. The image sensor of claim 6, wherein each of nine subpixels included in three second shared pixels comprises a second color filter that transmits an optical signal of a second color different from the first color, the three second shared pixels being arranged consecutively with the three first shared pixels in the first direction or the second direction and configured to sense the optical signal of the second color.

8. The image sensor of claim 1, wherein at least two additional first shared pixels consecutively arranged in parallel in at least one of the first direction and the second direction among the plurality of shared pixels are spaced apart from the at least two first shared pixels in the second direction and connected to a second column line among the plurality of column lines.

9. The image sensor of claim 1, wherein the plurality of subpixels comprises M subpixels arranged in a matrix in the first direction and the second direction, wherein M is an even number greater than or equal to 4.

10. The image sensor of claim 9, wherein the at least two first shared pixels connected to the first column line comprise M first shared pixels arranged in a matrix in the first direction and the second direction, and
M additional first shared pixels arranged in a matrix in the first direction and the second direction among the plurality of shared pixels are spaced apart from the M first shared pixels in the second direction and connected to a second column line adjacent to the first column line among the plurality of column lines.

11. The image sensor of claim 9, wherein the at least two first shared pixels connected to the first column line comprise M/2 first shared pixels consecutively arranged in parallel in the second direction, and M/2 additional first shared pixels consecutively arranged in parallel with the M/2 first shared pixels in the first direction are connected to a second column line adjacent to the first column line among the plurality of column lines.

12. The image sensor of claim 9, wherein the at least two first shared pixels connected to the first column line comprise M/4 first shared pixels consecutively arranged in parallel in the first direction.

13. The image sensor of claim 1, wherein a current source is connected to the plurality of column lines.

14. The image sensor of claim 1, wherein, in a first mode, the at least two first shared pixels sequentially output at least two first sensing signals generated in the at least two first shared pixels to the first column line, wherein each of the at least two first sensing signals indicates an amount of light sensed in one of the plurality of subpixels included in a corresponding first shared pixel among the at least two first shared pixels, and a first ADC among the plurality of ADCs receives the at least two first sensing signals sequentially received through the first column line, and generates two pixel values by sequentially analog-to-digital converting the at least two first sensing signals.

15. The image sensor of claim 14, wherein, in a second mode, the at least two first shared pixels simultaneously output at least two second sensing signals generated in the at least two first shared pixels to the first column line, wherein each of the at least two second sensing signals indicates an amount of light sensed in the plurality of subpixels included in a corresponding first shared pixel among the at least two first shared pixels, and the first ADC receives a combined sensing signal corresponding to an average value of the at least two second sensing signals through the first column line, and generates one pixel value by analog-to-digital converting the combined sensing signal.

16. An image sensor, comprising:
a pixel array, comprising:
a plurality of shared pixels arranged in a first direction and a second direction, each of the plurality of shared pixels comprising a plurality of photoelectric conversion elements connected to a same floating diffusion node; and
a plurality of column lines connected to the plurality of shared pixels, extending in the second direction, and arranged in parallel in the first direction; and
an analog-to-digital conversion circuit comprising a plurality of analog-to-digital converters (ADCs) connected to the plurality of column lines, wherein each of the plurality of ADCs converts a sensing signal received from a corresponding column line among the plurality of column lines into a pixel value,
wherein at least two first shared pixels, among the plurality of shared pixels, consecutively arranged in parallel in at least one of the first and second directions are configured to sense a first optical signal of a first color and the at least two first shared pixels are connected to different column lines among the plurality of column lines.

17. The image sensor of claim 16, wherein the plurality of photoelectric conversion elements comprises three photoelectric conversion elements consecutively arranged in parallel in the second direction, and
the at least two first shared pixels comprise three first shared pixels consecutively arranged in parallel in the first direction,
wherein the three first shared pixels are connected to three different adjacent column lines among the plurality of column lines.

18. The image sensor of claim 16, wherein the plurality of photoelectric conversion elements comprises M photoelectric conversion elements arranged in a matrix in the first direction and the second direction, wherein M is an even number greater than or equal to 4, and
a first shared pixel and a second shared pixel consecutively arranged in parallel in the first direction are respectively connected to a first column line and a second column line consecutively arranged in parallel in the first direction among the plurality of column lines.

19. The image sensor of claim 18, wherein a third shared pixel and a fourth shared pixel are respectively connected to the first column line and the second column line, the third shared pixel and the fourth shared pixel being configured to sense a second optical signal of the first color and consecutively arranged in parallel with the first shared pixel and the second shared pixel, respectively.

20. A pixel array of an image sensor, the pixel array comprising:
a plurality of subpixels arranged in a matrix in a first direction and a second direction; and
a plurality of output lines extending in the second direction, each of the plurality of output lines being arranged between two subpixels adjacent to each other in the first direction among the plurality of subpixels,
wherein a first pixel including nine subpixels configured to sense a first optical signal of a first color and arranged in a matrix among the plurality of subpixels is connected to a first output line among the plurality of output lines,
wherein a second pixel including nine subpixels configured to sense the first optical signal of the first color and arranged in a matrix among the plurality of subpixels, and adjacent to the first pixel in the second direction, is connected to a second output line among the plurality of output lines.

* * * * *